(12) United States Patent
Takeya et al.

(10) Patent No.: US 8,102,172 B2
(45) Date of Patent: Jan. 24, 2012

(54) POSITION DETECTOR INCLUDING MAGNETORESISTIVE ELEMENTS

(75) Inventors: Tsutomu Takeya, Niigata-ken (JP); Takafumi Noguchi, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 731 days.

(21) Appl. No.: 12/256,879

(22) Filed: Oct. 23, 2008

(65) Prior Publication Data

US 2009/0051353 A1 Feb. 26, 2009

(30) Foreign Application Priority Data

Mar. 20, 2007 (JP) ................................. 2007-073283
Jan. 8, 2008 (JP) ................................. 2008-001286
Mar. 6, 2008 (WO) .................. PCT/JP2008/054018

(51) Int. Cl.
*G01B 7/14* (2006.01)

(52) U.S. Cl. ......... 324/207.21; 324/207.22; 324/207.23; 324/207.26; 324/173; 324/174; 324/225; 324/252; 324/207.25; 324/207.24; 338/32 R; 360/324.2

(58) Field of Classification Search ............. 324/207.22, 324/207.23, 207.26, 173, 174, 225, 207.21, 324/252, 207.25, 207.24; 338/32 R; 360/324.2
See application file for complete search history.

(56) References Cited

U.S. PATENT DOCUMENTS

| | | | | |
|---|---|---|---|---|
| 4,832,144 A * | 5/1989 | Murakami et al. | ......... | 178/18.07 |
| 6,124,711 A * | 9/2000 | Tanaka et al. | ................. | 324/252 |
| 7,053,607 B2 * | 5/2006 | Sato | .............. | 324/224 |
| 7,265,540 B2 * | 9/2007 | Sudo et al. | ............... | 324/207.21 |
| 7,443,158 B2 * | 10/2008 | Oohashi et al. | .......... | 324/207.22 |
| 7,589,528 B2 * | 9/2009 | Sato et al. | ..................... | 324/252 |
| 7,589,939 B2 * | 9/2009 | Wakul et al. | ............... | 360/324.1 |
| 7,800,356 B2 * | 9/2010 | Takeya et al. | ............ | 324/207.21 |
| 2003/0094944 A1 * | 5/2003 | Suzuki et al. | ................ | 324/252 |
| 2003/0112006 A1 * | 6/2003 | Luetzow | ................. | 324/207.21 |
| 2005/0061658 A1 * | 3/2005 | Lin et al. | .................... | 204/192.2 |
| 2005/0200449 A1 * | 9/2005 | Oohashi et al. | ............. | 338/32 R |
| 2006/0066303 A1 * | 3/2006 | Oohashi et al. | ................ | 324/249 |
| 2007/0064352 A1 * | 3/2007 | Gill | .......................... | 360/324.11 |
| 2008/0284420 A1 * | 11/2008 | Takeya et al. | ............ | 324/207.21 |

OTHER PUBLICATIONS

Groenland, "Magnetoresistive Transducer for Absolute Position Detection", IEEE Transactions on Magnetics, vol. MAG-20, No. 5, Sep. 1984, pp. 969-971.*

(Continued)

*Primary Examiner* — Huy Q Phan
*Assistant Examiner* — Lamarr Brown
(74) *Attorney, Agent, or Firm* — Brinks Hofer Gilson & Lione

(57) ABSTRACT

A circular top surface of a magnet is magnetized to the N-pole, and a back surface thereof is magnetized to the S-pole. A detector moves within the X-Y plane at positions located away from the top surface of the magnet. A pair of X-direction detecting elements and a pair of the Y-direction detecting elements are provided in the detector. In the X-direction detecting elements, the directions of a bias magnetic field provided to free magnetic layers are opposite to each other. When the detector moves in the Y direction, a decrease in the sensitivity of one of the X-direction detecting elements is compensated for by an improvement in the sensitivity of the other element. This also applies to the Y-direction detecting elements. Accordingly, position detection outputs of the X direction and the Y direction can be accurately obtained from the detector.

10 Claims, 14 Drawing Sheets

OTHER PUBLICATIONS

Wang et al., "A Localization Method Using 3-axis Magnetoresistive Sensors for Tracking of Capsule Endoscope", Proceeedings of the 28th IEEE EMBS Annual International Conference Aug. 30-Sep. 3, 2006, pp. 2522-2525.*

* cited by examiner

POSITION DETECTOR INCLUDING MAGNETORESISTIVE ELEMENTS

CLAIM OF PRIORITY

This application claims benefit of the Japanese Patent Application No. 2007-073283 filed on Mar. 20, 2007, and No. 2008-001286 filed on Jan. 8, 2008, which are hereby incorporated by reference.

BACKGROUND OF THE INVENTION

1. Field of the Invention

The present invention relates to a position detector with which the position of a movable part within a plane can be determined using magnetoresistive elements that can detect the direction and the intensity of a magnetic field, and a magnet.

2. Description of the Related Art

Japanese Unexamined Patent Application Publication Nos. 2005-331401, 2005-69744, and 2004-69695 disclose position detectors including a magnet and a detector configured to detect a magnetic field generated from the magnet.

In the position detectors disclosed in the above patent documents, an element that can detect magnetic field intensity, such as a Hall element, is provided in the detector. The position at which the magnet and the detector face each other is determined by detecting with the detector the intensity of a magnetic field component in a direction orthogonal to a surface of the magnet among magnetic field components generated from the surface of the magnet.

However, in the position detectors disclosed in the above patent documents, the detector includes an element, e.g., a Hall element, which can detect only the intensity of a magnetic field perpendicular to the surface of the magnet. Accordingly, an area where the position can be identified with the detector is limited. For example, in a position detector in which a top surface of a magnet is magnetized to the N-pole, the back surface thereof is magnetized to the S-pole, and a detector faces the top surface, the change in the intensity of a magnetic field component perpendicular to the top surface when the detector moves away from the center of the top surface of the magnet to one side is the same as that when the detector moves away from the center of the magnet to the other side. Therefore, in the case where the detector moves through the center, even when the intensity of the magnetic field is detected with the detector, the detector cannot distinguish whether the position of the detector is located in one area or the other area with respect to the center.

Accordingly, the area in which a position can be detected with the detector is very narrow. In order to accurately detect the position of a detector located on X-Y coordinates over a wide area, it is necessary to increase the size of a magnet. Furthermore, when a Hall element is used as the detector, a circuit constituting the detector is also complex.

Japanese Unexamined Patent Application Publication No. 2006-276983 discloses a magnetic sensor which detects a magnetic field generated from a circular magnet when the magnet moves. This magnetic sensor includes four giant magnetoresistive elements. Among the giant magnetoresistive elements, two giant magnetoresistive elements detect an X-direction component of a magnetic flux generated from the magnet, and two other giant magnetoresistive elements detect a Y-direction component of the magnetic flux generated from the magnet. For example, the difference in the change in the resistance of the two giant magnetoresistive elements that detect the X-direction component of the magnetic flux is determined, and the difference in the change in the resistance of the two other giant magnetoresistive elements that detect the Y-direction component of the magnetic flux is determined. Thereby, the position of the magnet is recognized.

However, each of the giant magnetoresistive elements has a structure in which magnetic fluxes in opposite directions, namely, in the positive direction and in the negative direction cannot be distinguished from each other. Accordingly, it is difficult to accurately know the movement position of the magnet.

In addition, for example, when the two giant magnetoresistive elements that detect the X-direction component of a magnetic flux move from the center of the magnet to a position away in the Y direction, not only the X-direction component of the magnetic field but also the Y-direction component of the magnetic field acts on a free magnetic layer of the giant magnetoresistive elements. Consequently, the magnetization of the free magnetic layer becomes unstable, and thus it is difficult to accurately know a change in the resistance corresponding to a movement position of the magnet in the X direction.

SUMMARY OF THE INVENTION

The present invention has been conceived in order to solve the above described problems of the related art. The present invention provides a position detector which includes magnetoresistive elements and with which a position in a wide area including the center of a surface of a relatively small magnet can be known using the magnet and detectors.

In addition, the present invention provides a position detector which includes magnetoresistive elements and in which a change in the resistance corresponding to the movement position of a detector can be accurately detected even when the detector is away from the center of the magnet.

Furthermore, the present invention provides a position detector which can detect a movement position of a stage to which motive forces are provided in the X-Y directions or a position detector with which movement information of an operation unit operated by hand in a plurality of directions can be obtained using a single magnet.

The present invention provides a position detector including a fixed part; a movable part configured to face the fixed part and to move within a plane; a magnet provided on one of the fixed part and the movable part; and a detector provided on the other of the fixed part and the movable part and configured to detect a magnetic field generated from the magnet. In the position detector, the magnet has a top surface facing the detector, and the top surface and a back surface of the magnet are magnetized to magnetic poles different from each other; the detector includes a first X-direction detecting element and a second X-direction detecting element each configured to detect the direction and intensity of the magnetic field parallel to an X axis, and a first Y-direction detecting element and a second Y-direction detecting element each configured to detect the direction and intensity of the magnetic field parallel to a Y axis, the X axis and the Y axis being orthogonal to each other within the plane on which the movable part moves; each of the first X-direction detecting element, the second X-direction detecting element, the first Y-direction detecting element, and the second Y-direction detecting element is a magnetoresistive element whose electrical resistance changes on the basis of the relationship between the direction of the magnetization of a pinned magnetic layer and the direction of the magnetization of a free magnetic layer; in the first X-direction detecting element and the second X-direction detecting element, bias magnetic fields provided to the free magnetic layers act in opposite directions parallel to the Y axis, and in the first Y-direction detecting element and the second Y-direction detecting element, bias magnetic fields provided to the free magnetic layers act in opposite directions parallel to the X axis; a movement position of the movable part in a direction parallel to the X axis can be determined from an output obtained from a change in the resistance of the first X-direction detecting element and an output obtained from a change in the resistance of the second X-direction detecting element, and a movement position of the movable part in a direction parallel to the Y axis can be determined from an output obtained from a change in the resistance of the first Y-direction detecting element and an output obtained from a change in the resistance of the second Y-direction detecting element.

Each of the detecting elements used in the position detector of the present invention is a magnetoresistive element using a giant magnetoresistive effect, the magnetoresistive element including a pinned magnetic layer and a free magnetic layer to which a bias magnetic field is provided. By crossing the direction of the magnetization of the pinned magnetic layer and the direction of the bias magnetic field, detection can be performed while discriminating a position of the positive direction of the X axis from a position of the negative direction of the X axis, and a position of the positive direction of the Y axis from a position of the negative direction of the Y axis.

In the first X-direction detecting element and the second X-direction detecting element, the bias magnetic fields act in opposite directions parallel to the Y axis. Accordingly, when each of the X-direction detecting elements has moved in a direction parallel to the Y axis, the effect of a Y-direction component of the magnetic field generated from the magnet on the bias magnetic field can be cancelled out between the two X-direction detecting elements. Consequently, each of the X-direction detecting elements has moved in a direction parallel to the Y axis, a decrease in the detection accuracy of the X-direction component of the magnetic field can be suppressed. This advantage also applies to the two Y-direction detecting elements.

In the present invention, the first X-direction detecting element and the second X-direction detecting element are preferably arranged at positions having the same X coordinate, and the first Y-direction detecting element and the second Y-direction detecting element are preferably arranged at positions having the same Y coordinate.

When the two X-direction detecting elements are arranged at positions having the same X coordinate, the accuracy for canceling out the effect of the Y-direction component of the magnetic field on the bias magnetic field between the two X-direction detecting elements can be increased. This also applies to the two Y-direction detecting elements.

Furthermore, in the present invention, the first X-direction detecting element and the second X-direction detecting element are preferably arranged with a space therebetween in a direction parallel to the Y axis, and the first Y-direction detecting element and the second Y-direction detecting element are preferably arranged with a space therebetween in a direction parallel to the X axis.

Alternatively, the first X-direction detecting element and the second X-direction detecting element may be stacked in the thickness direction of the magnet. This also applies to the first Y-direction detecting element and the second Y-direction detecting element.

In the present invention, the magnetization of the pinned magnetic layer of each of the first X-direction detecting element and the second X-direction detecting element is preferably oriented in a direction parallel to the X axis, and the magnetization of the pinned magnetic layer of each of the first Y-direction detecting element and the second Y-direction detecting element is preferably oriented in a direction parallel to the Y axis.

According to the above structure, in each of the detecting elements, the magnetization direction of the pinned magnetic layer and the direction of the bias magnetic field acting on the free magnetic layer can be made orthogonal to each other.

Furthermore, in the present invention, the movement position of the movable part in a direction parallel to the X axis may be determined by adding the absolute value of a change in the voltage based on a change in the resistance of the first X-direction detecting element and the absolute value of a change in the voltage based on a change in the resistance of the second X-direction detecting element, and the movement position of the movable part in a direction parallel to the Y axis may be determined by adding the absolute value of a change in the voltage based on a change in the resistance of the first Y-direction detecting element and the absolute value of a change in the voltage based on a change in the resistance of the second Y-direction detecting element.

The top surface of the magnet is basically a flat surface. Alternatively, projecting portions and recessed portions may be regularly provided on the top surface of the magnet.

In the present invention, the top surface of the magnet preferably has a circular shape.

When the top surface has a circular shape, in each direction extending from the center of the top surface in the radial direction, the intensity of the magnetic field parallel to a movement plane, the intensity changing as the position is away from the center, changes uniformly. Accordingly, the detector can easily detect with high accuracy the position facing the surface of the magnet. Alternatively, the top surface of the magnet may have, for example, an elliptical shape or a rectangle having rounded corners.

In the present invention, preferably, the coordinate position of the movable part in the positive direction and the negative direction of the X axis and the coordinate position of the movable part in the positive direction and the negative direction of the Y axis with the center of the top surface of the magnet therebetween can be determined.

In the present invention, the position detector may further include a supporting base, a stage supported on the supporting base so as to be movable in a direction parallel to the X axis and in a direction parallel to the Y axis, and actuators configured to provide the stage with motive forces in a direction parallel to the X axis and in a direction parallel to the Y axis, wherein the magnet is provided on one of the supporting base and the stage, and the detector is provided on the other of the supporting base and the stage.

For example, in the present invention, the position detector may further include a camera lens provided on the stage, a sensor configured to detect a movement of the supporting base, and a controller to which outputs of the sensor and detection outputs of the detector are input, wherein the controller calculates the amounts of correction movement of the stage on the basis of the outputs from the sensor, provides the actuators with driving signals on the basis of the amounts of correction movement and movement information on the stage obtained in the detector, and controls the stage to move in a direction in which a transfer velocity is cancelled out.

In the above invention, a single magnet is provided on one of the supporting base and the stage, and a detector facing the magnet is provided on the other of the supporting base and the stage. Accordingly, information about the movement of the stage in a direction parallel to the X axis and a direction parallel to the Y axis can be obtained from the detector. In this structure, a magnet for detecting the amount of movement of a direction parallel to the X axis and a magnet for detecting the amount of movement of a direction parallel to the Y axis need not be separately provided. Therefore, the size of the whole detector can be reduced, and the weight of the stage driven by the actuators can also be reduced.

Furthermore, in the present invention, the position detector may further include a supporting base, and an operation body configured to be movable on the supporting base at least in a direction parallel to the X axis and a direction parallel to the Y axis, wherein the magnet is provided on one of the supporting base and the operation body and the detector is provided on the other of the supporting base and the operation body, and operating directions and the amounts of operation of the operation body can be detected from detection outputs of the detector.

In the above position detector, a movement direction and the amount of movement parallel to the X axis of the operation body and a movement direction and the amount of movement parallel to the Y axis of the operation body can be detected, and input operation in the other direction can be performed with the structure including a single magnet.

According to the present invention, when a magnet and a detector relatively move along a movement plane, the position facing the magnet can be known in a relatively wide area using the detector. Accordingly, position detection with high accuracy can be realized in a compact precision instrument or the like. Furthermore, when the detector moves away from the center of the magnet in a direction parallel to the X axis and in a direction parallel to the Y axis, an X-direction component and a Y-direction component of the magnetic flux can be detected with high accuracy.

Furthermore, the position detector of the present invention can be composed of a single magnet and a detector facing the magnet. Accordingly, a magnet for detecting a direction parallel to the X axis and a magnet for detecting a direction parallel to the Y axis need not be separately provided. Therefore, the number of parts can be reduced, and the size of the instrument can be reduced. In addition, in an instrument in which a magnet is provided at the movable side, it is not necessary to provide a large number of magnets at the movable side, and thus the weight at the movable side can be reduced.

DESCRIPTION OF THE PREFERRED EMBODIMENTS

Figure 1:
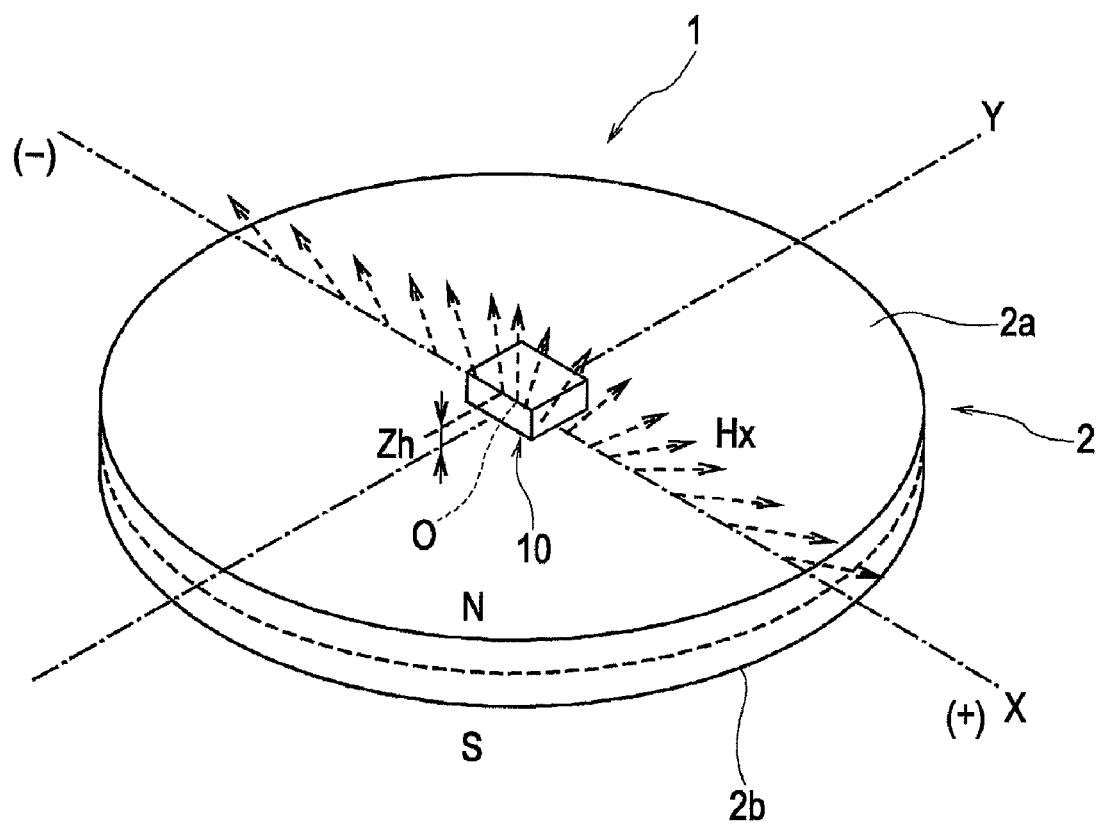
FIG. 1 is a perspective view showing a position detector according to an embodiment of the present invention.

FIG. 1 is a perspective view showing a position detector 1 according to an embodiment of the present invention.

The position detector 1 includes a magnet 2 and a detector 10 facing the magnet 2. The magnet 2 has a uniform thickness so that a top surface 2a and a back surface 2b are parallel to each other. An X axis and a Y axis shown in FIG. 1, FIG. 3, and other figures are orthogonal coordinates. A plane including the X axis and the Y axis is a movement plane, and this movement plane is parallel to the top surface 2a. The detector 10 is fixed and the magnet 2 can move to any position in the X-Y coordinates within the movement plane. Alternatively, the magnet 2 is fixed and the detector 10 can move to any position in the X-Y coordinates within the movement plane.

Each of the top surface 2a and the back surface 2b of the magnet 2 preferably has a circular shape. In the perspective view of FIG. 1 and the plan views of FIGS. 3, 4, 7, and 8, the center of the circle, i.e., the center of the magnet 2 is denoted by "O". The center O is the intersection of the X axis and the Y axis. As shown in FIG. 1, the top surface 2a of the magnet 2 is magnetized to the N-pole (north pole), and the back surface 2b of the magnet 2 is magnetized to the S-pole (south pole). Lines of magnetic force are generated from the entire area of the top surface 2a to the entire area of the back surface 2b. The detector 10 moves within the movement plane including the X axis and the Y axis at positions located at a predetermined height Zh from the top surface 2. Alternatively, the detector 10 may face the back surface 2b magnetized to the S-pole and move within the movement plane including the X axis and the Y axis at positions away from the back surface 2b.

Figure 2:
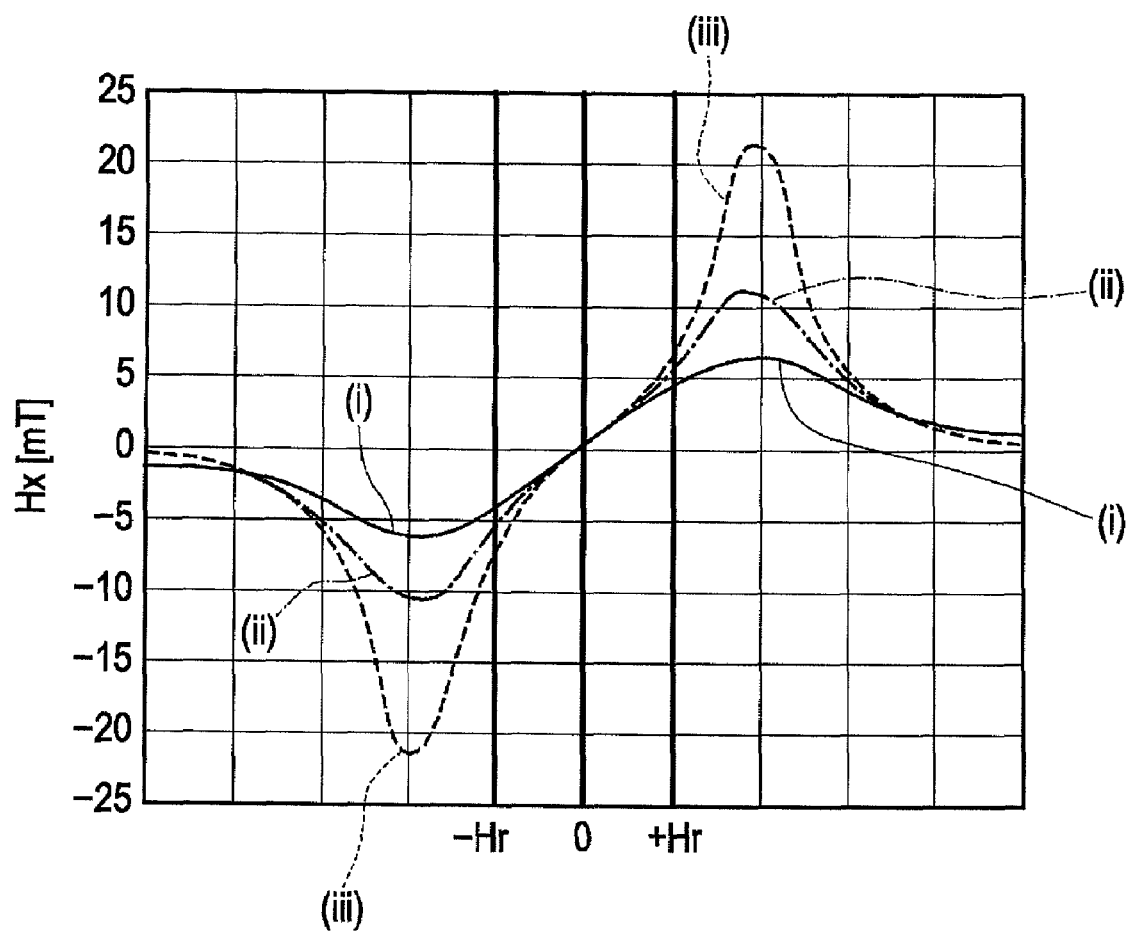
FIG. 2 is a diagram showing a change in the intensity Hx of a magnetic field on the X axis extending in a direction parallel to a top surface of a magnet.

In FIG. 1, among the lines of magnetic force generated from the top surface 2a of the N-pole of the magnet 2, only lines of magnetic force located on the X axis are shown by the broken lines. FIG. 2 shows the relationship between the distance of the magnet 2 on the X axis from the center O and the intensity Hx of a magnetic field of the X direction at the position. In FIG. 2, the magnet 2 has a disc shape having a diameter of 5 mm and a thickness of 1 mm. FIG. 2 shows the magnetic field intensities Hx of the X direction at positions at which the height Zh from the top surface 2a of the magnet 2 is 1.5 mm, 1.0 mm, and 0.5 mm. Curve (i) shows a change in the intensity Hx of a magnetic field of the X direction at which the height Zh is 1.5 mm, curve (ii) shows a change in the intensity Hx when the height Zh is 1.0 mm, and curve (iii) shows a change in the intensity Hx when the height Zh is 0.5 mm. In FIG. 2, the intensity Hx of a magnetic field oriented in the X (+) direction is represented by a positive sign, and the intensity Hx of the magnetic field oriented in the X (−) direction is represented by a negative sign.

On the top surface 2a of the magnet 2, in the range from +Hr to −Hr in the X direction with the center therebetween, the intensity Hx of the magnetic field oriented in the X direction changes substantially on the basis of a linear function. The range between +Hr and −Hr is different depending on the diameter of the magnet, the intensity of the magnetic field, and the like. When the diameter is 5 mm, the intensity of the magnetic field changes substantially on the basis of a linear function in the range from +2 mm of +Hr to −2 mm of −Hr. This also applies to a change in the intensity Hy of a magnetic field oriented in the Y direction on the Y axis. Furthermore, as shown in FIG. 3, a radial axis α which is an arbitrary axis other than the X axis and the Y axis and which passes through the enter O is assumed, the intensity Hα of a magnetic field directed along the radial axis α changes substantially on the basis of a linear function at the same rate as that of the change in the intensity Hx of the magnetic field on the X axis and that of the change in the intensity Hy of the magnetic field on the Y axis.

Figure 3:
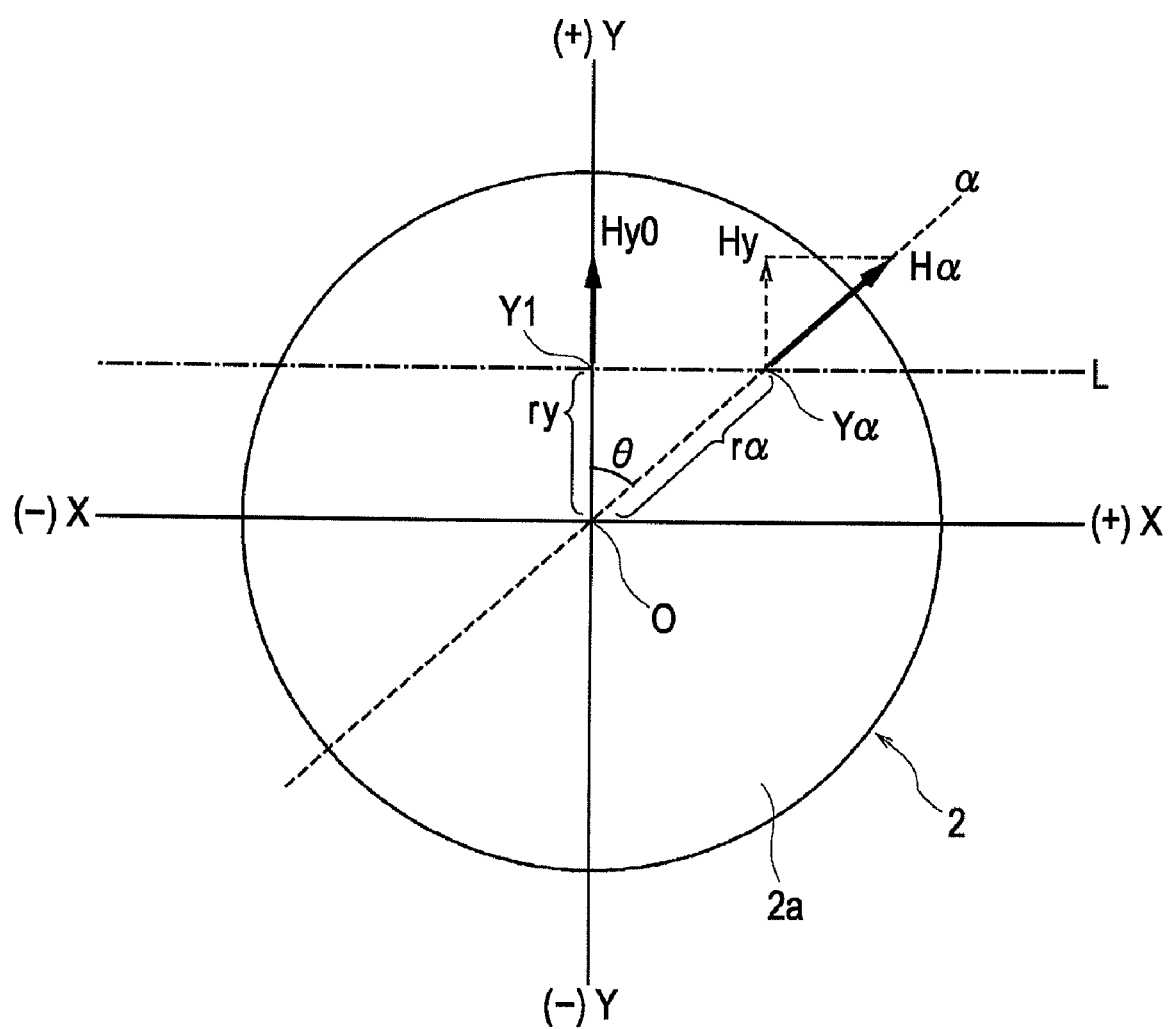
FIG. 3 is a plan view of the magnet.

In FIG. 3, a line which is parallel to the X axis and which passes through a position Y1 on the Y axis on the top surface 2a of the magnet 2 is shown by L. The distance between the center O and the position Y1 on the Y axis is represented by a radius ry. When the intersection of the radial axis α and line L is represented by Yα, the distance between the center O and the intersection Yα is represented by a radius rα.

The intensity of the magnetic field of the Y direction at the position Y1 is represented by Hy0, and the intensity of the magnetic field in the direction of the radial axis α at the intersection Yα is represented by Hα. The intensity Hy0 is proportional to the radius ry, and the intensity Hα is also proportional to the radius rα. In addition, the rate of change in the intensity of the magnetic field directed along the Y axis is the same as the rate of change in the intensity of the magnetic field directed along the radial axis α, and the intensity of the magnetic field changes on the basis of a linear function. When the constant of proportion of the rate of change of this linear function is represented by a, the intensity $Hy0 = a \cdot ry$, and the intensity $H\alpha = a \cdot r\alpha$.

When the angle formed by the Y axis and the radial axis α is represented by θ, the intensity Hy of a Y-direction component of the magnetic field at the intersection Yα is represented by $Hy = H\alpha \cdot \cos \theta = a \cdot r\alpha \cdot \cos \theta$. Here, $r\alpha \cdot \cos \theta = ry$, and thus, $Hy = a \cdot ry = Hy0$.

That is, as shown in FIG. 2, on each radial axis passing through the center O, in an area where the intensity of the magnetic field directed along the radial axis changes on the basis of a linear function as the position is away from the center O, the intensity Hy of the Y-direction component of the magnetic field is constant at any position on a line parallel to the X axis, and the intensity Hx of the X-direction component of the magnetic field is constant at any position on a line parallel to the Y axis.

Accordingly, by installing an X-direction detecting element that detects the intensity of the X-direction component of the magnetic field and a Y-direction detecting element that detects the intensity of the Y-direction component of the magnetic field, the position at which the center of the detector 10 faces the top surface 2a of the magnet 2 can be known. Furthermore, when the X-direction detecting element can detect the positive and negative directions of the X-direction component of the magnetic field and the Y-direction detecting element can detect the positive and negative directions of the Y-direction component of the magnetic field, which position the center of the detector 10 facing the top surface 2a of the magnet 2 is located at the (+)X side or at the (−)X side with respect to the center O can be detected, and which position the center of the detector 10 facing the top surface 2a of the magnet 2 is located at the (+)Y side or at the (−)Y side with respect to the center O can also be detected.

Figure 5A:
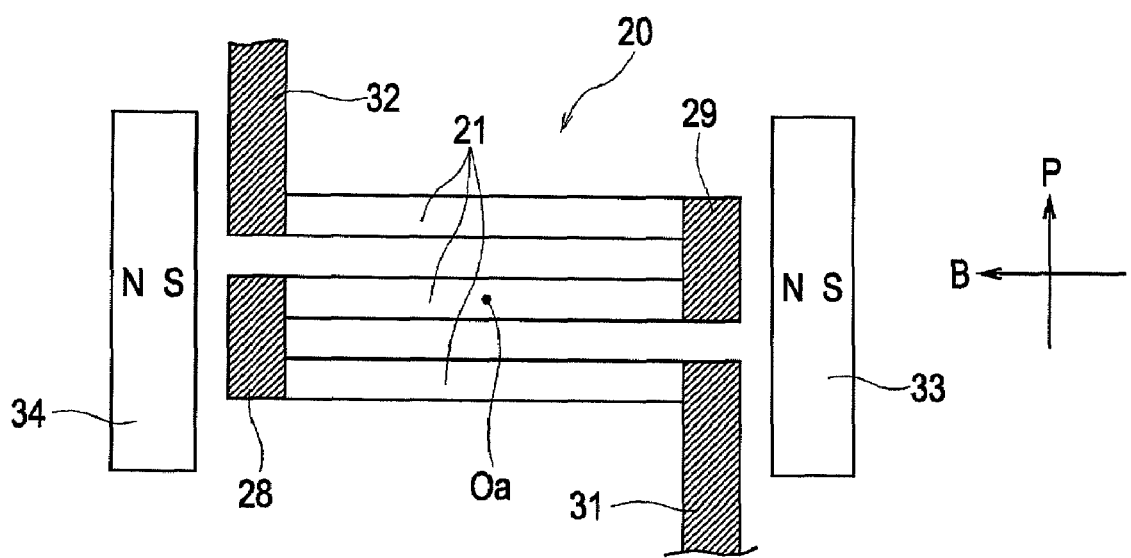
FIG. 5A is a plan view showing the structure of a magnetoresistive element.

FIG. 5A shows a magnetoresistive element 20 used as the X-direction detecting element that can detect the positive and negative directions of the X-direction component of the magnetic field and the intensity of the magnetic field or the Y-direction detecting element that can detect the positive and negative directions of the Y-direction component of the magnetic field and the intensity of the magnetic field.

In the magnetoresistive element 20, a plurality of element portions 21 are provided so as to parallel with each other. Two front ends of the element portions 21 are connected to each other with a connection electrode 28, and two rear ends of the element portions 21 are connected to each other with a connection electrode 29. Lead electrodes 31 and 32 are connected to element portions 21 located at the top and bottom ends in the figure. Accordingly, the element portions 21 are connected in series to form a meander pattern. In FIG. 5A, the geometric center of the element portions 21 is shown by Oa.

Figure 6:
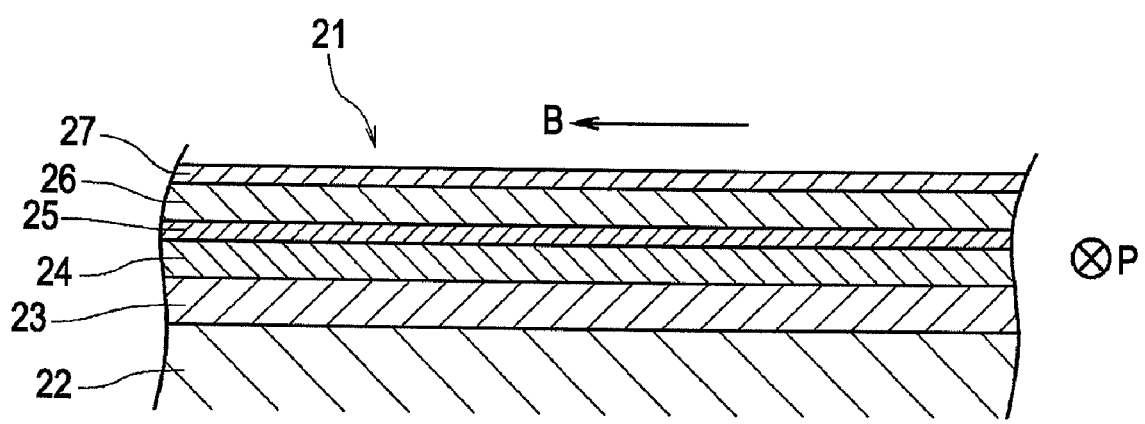
FIG. 6 is a cross-sectional view of an element portion of the magnetoresistive element.

As shown in the cross-sectional view of FIG. 6, each of the element portions 21 is a laminate produced by depositing, on a substrate 22, an antiferromagnetic layer 23, a pinned magnetic layer 24, a nonmagnetic conductive layer 25, and a free magnetic layer 26 in that order. The surface of the free magnetic layer 26 is covered with a protective layer 27.

The antiferromagnetic layer 23 is made of an antiferromagnetic material such as an iridium-manganese alloy (Ir—Mn alloy). The pinned magnetic layer 24 is made of a soft magnetic material such as a cobalt-iron alloy (Co—Fe alloy). The nonmagnetic conductive layer 25 is made of, for example, copper (Cu). The free magnetic layer 26 is made of a soft magnetic material such as a nickel-iron alloy (Ni—Fe alloy). The protective layer 27 is a tantalum (Ta) layer.

In each of the element portions 21, the magnetization direction of the pinned magnetic layer 24 is pinned by an antiferromagnetic coupling between the antiferromagnetic layer 23 and the pinned magnetic layer 24. As shown in FIG. 5A, in each of the element portions 21, the pinned direction (P direction) of the magnetization of the pinned magnetic layer 24 is orthogonal to the longitudinal direction of the element portion 21.

Figure 5B:
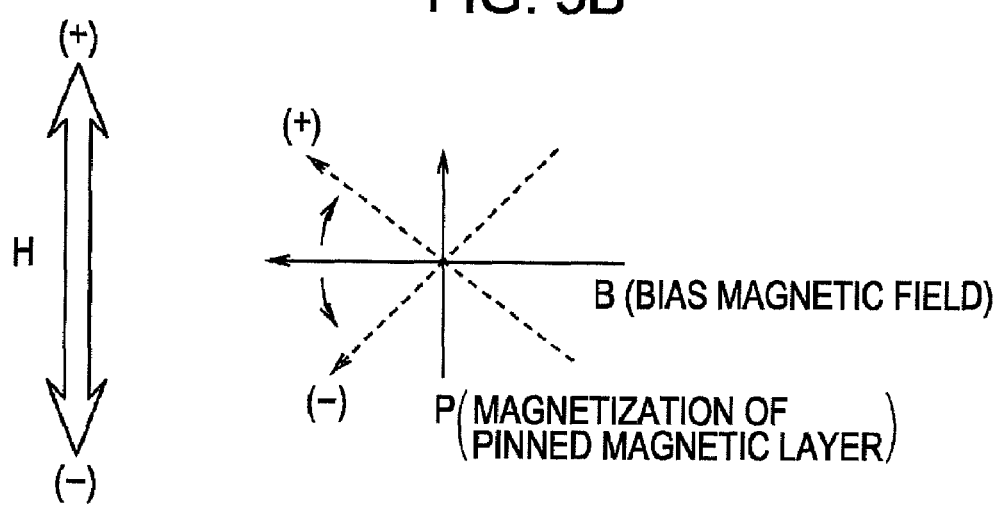
FIG. 5B is a diagram showing a magnetization direction of a pinned magnetic layer of the magnetoresistive element and a direction of a bias magnetic field.

As shown in FIG. 5A, a magnet 33 is provided at the right side of the magnetoresistive element 20, and a magnet 34 is provided at the left side of the magnetoresistive element 20. A bias magnetic field is provided to each of the element portions 21 in a direction parallel to the longitudinal direction of the element portions 21. The magnetization of the free magnetic layer 26 is oriented towards the B direction by the bias magnetic field to form a single magnetic domain. As shown by the solid lines in FIG. 5B, when the intensity H of an external magnetic field acting in a direction parallel to the pinned direction (P direction) of the magnetization of the pinned magnetic layer 24 is zero, the magnetization direction in the free magnetic layer 26 is oriented towards the B direction in which the bias magnetic field acts. In this case, the magnetization direction of the free magnetic layer 26 is orthogonal to the pinned direction (P direction) of the magnetization of the pinned magnetic layer 24.

The electrical resistance of the magnetoresistive element 20 changes on the basis of the relationship between the pinned direction (P direction) of the magnetization of the pinned magnetic layer 24 and the direction of the magnetization of the free magnetic layer 26. When an external magnetic field is provided to an element portion 21 of the magnetoresistive element 20 in the upward direction of FIG. 5B (in the (+) direction parallel to the pinned direction P), the direction of the magnetization in the free magnetic layer 26 on which the bias magnetic field acts inclines to the (+) direction. In this case, as the angle formed by the direction of the magnetization in the free magnetic layer 26 and the pinned direction (P direction) of the magnetization of the pinned magnetic layer 24 decreases, the electrical resistance decreases. When an external magnetic field is provided in the downward direction of FIG. 5B (in the (−) direction parallel to the pinned direction P), the direction of the magnetization in the free magnetic layer 26 on which the bias magnetic field acts inclines to the (−) direction. In this case, as the slope of the direction of the magnetization in the free magnetic layer 26 in the counterclockwise direction increases, the electrical resistance increases.

Figure 4:
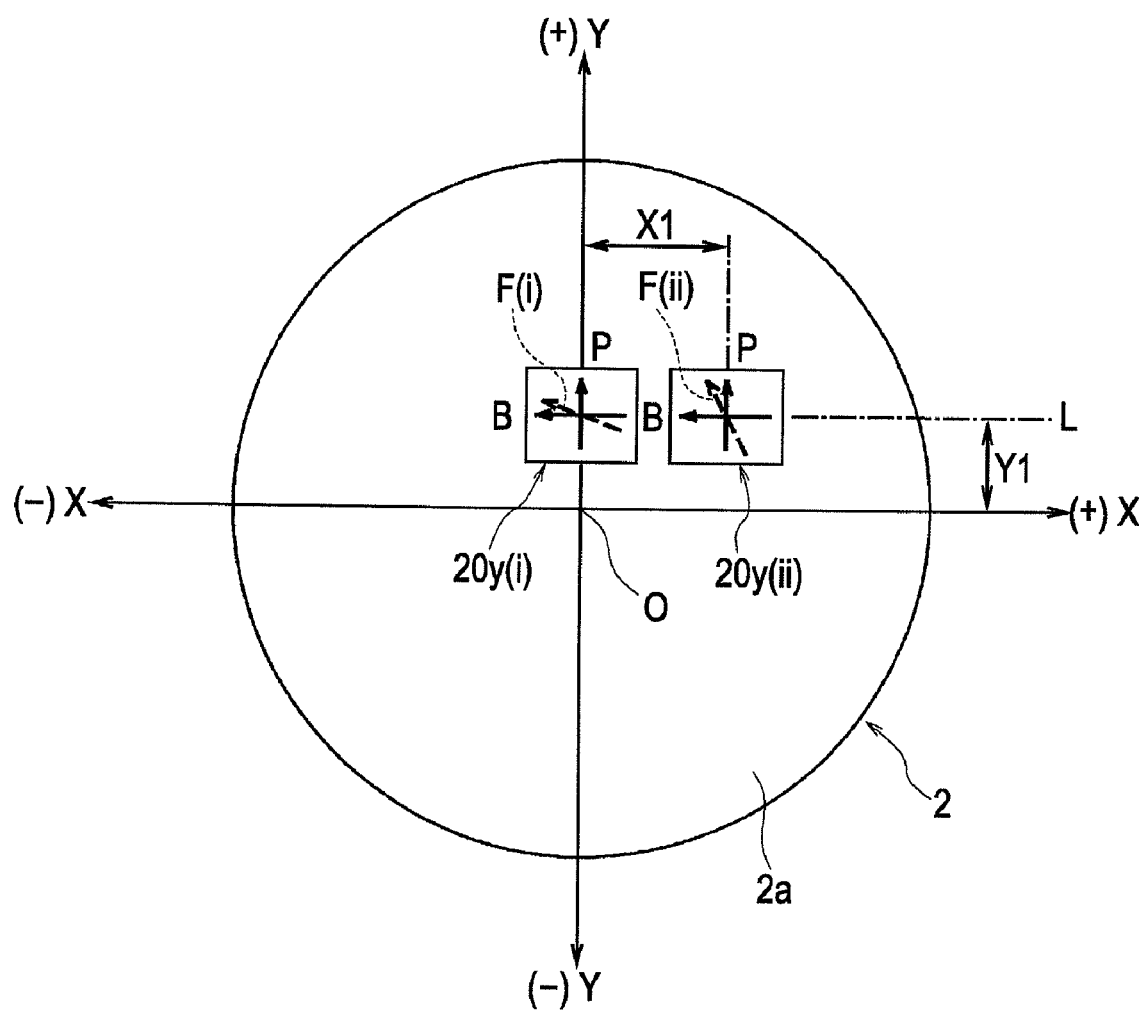
FIG. 4 is a plan view for illustrating a principle of a position detection using magnetoresistive elements, and for illustrating a problem in the case where a single X-direction detecting element and a single Y-direction detecting element are used.

As shown in FIG. 4, a Y-direction detecting element 20$y$ having the same structure as the magnetoresistive element 20 is disposed so that the Y-direction detecting element 20$y$ faces the top surface 2$a$ of the magnet 2 at a height Zh in the range of 0.5 to 1.5 mm, the pinned direction (P direction) of the magnetization of the pinned magnetic layer 24 of the element portions 21 of the Y-direction detecting element 20$y$ is oriented towards the (+)Y direction, and the bias direction (B direction) is oriented towards the (−)X direction. In this case, by detecting a change in the resistance of the Y-direction detecting element 20$y$, the Y coordinate of the position at which the Y-direction detecting element 20$y$ faces the top surface 2$a$ of the magnet 2 can be known.

More specifically, as the Y-direction detecting element 20$y$ moves in the (+)Y direction, the direction of the magnetization of the free magnetic layer 26 inclines toward the (+)Y direction. Consequently, the electrical resistance of the Y-direction detecting element 20$y$ gradually decreases. On the other hand, as the Y-direction detecting element 20$y$ moves in the (−)Y direction, the direction of the magnetization of the free magnetic layer 26 inclines toward the (−)Y direction. Consequently, the electrical resistance of the Y-direction detecting element 20$y$ increases.

However, when the movement position in the Y direction is detected with a single Y-direction detecting element 20$y$ as shown in FIG. 4, the following problem occurs.

In FIG. 4, a Y-direction detecting element 20$y$ when the center Oa of the element portions 21 is located on the Y axis is shown by symbol 20$y$(i), and the Y-direction detecting element 20$y$ when the center Oa of the element portions 21 shifts from the Y axis by a distance X1 in the (+)direction is shown by symbol 20$y$(ii). In FIG. 4, both the Y-direction detecting element 20$y$(i) and the Y-direction detecting element 20$y$(ii) are disposed on line L which passes through a position Y1 on the Y axis and which is parallel to the X axis. Therefore, the intensity of the (+)Y-direction component of the magnetic field acting on the Y-direction detecting element 20$y$(i) is the same as that of the Y-direction detecting element 20$y$(ii). Accordingly, the electrical resistance of the Y-direction detecting element 20$y$(i) should be the same as the electrical resistance of the Y-direction detecting element 20$y$(ii).

Here, theoretically, no X-direction component of the magnetic field generated from the top surface 2$a$ of the magnet 2 acts on the Y-direction detecting element 20$y$(i), in which the center Oa of the element portions 21 is located on the Y axis. Therefore, in the Y-direction detecting element 20$y$(i), the bias magnetic field acting on the element portions 21 in the B direction is not affected by an X-direction component of the magnetic field generated from the magnet 2. In contrast, in the Y-direction detecting element 20$y$(ii) in the case where the center Oa of the element portions 21 is shifted to the (+)X direction, in addition to the bias magnetic field, a (+)X-direction component of the magnetic field generated from the magnet 2 acts on the free magnetic layer 26. As shown in FIG. 3, when the intensity of the magnetic field of the radial axis α direction acting on the Y-direction detecting element 20$y$(ii) is represented by Hα, the intensity of the X-direction component of the magnetic field generated from the magnet 2 and acting on the Y-direction detecting element 20$y$(ii) is represented by Hα·sin θ. Accordingly, in the Y-direction detecting element 20$y$(ii), a magnetic field in the (+)X direction, which is opposite to the direction B of the bias magnetic field, acts on the free magnetic layer 26.

As described above, in the Y-direction detecting element 20$y$(i) located on the Y axis and the Y-direction detecting element 20$y$(ii) when being shifted in the (+)X direction on line L, the Y-direction components of the magnetic field acting on the detecting elements are the same, but the X-direction components of the magnetic field acting on the free magnetic layers 26 of the detecting elements are different from each other. Consequently, the intensity of the bias magnetic field acting on the free magnetic layer 26 substantially changes in the Y-direction detecting element 20$y$(i) and the Y-direction detecting element 20$y$(ii). More specifically, in the Y-direction detecting element 20$y$(i), the X-direction component of the magnetic field is about zero, and thus, the intensity of the bias magnetic field acting on the free magnetic layer 26 is determined by the magnets 33 and 34 shown in FIG. 5A. On the other hand, in the Y-direction detecting element 20$y$(ii), the direction B of the bias magnetic field is the (−)X direction, and the X-direction component of the magnetic field is oriented in the (+)X direction, and thus the bias magnetic field is substantially decreased.

Therefore, the magnetization direction F (ii) of the free magnetic layer 26 in the Y-direction detecting element 20$y$(ii) is rotated in the clockwise direction so as to have a larger angle, as compared with the case where the magnetization direction F (i) of the free magnetic layer 26 in the Y-direction detecting element 20$y$(i) is rotated in the clockwise direction. As a result, the electrical resistance of the Y-direction detecting element 20$y$(ii) becomes lower than the electrical resistance of the Y-direction detecting element 20$y$(i).

In contrast, when the Y-direction detecting element 20$y$ moves to the (−)X side with respect to the Y axis, the direction of the bias magnetic field acting on the free magnetic layer 26 is the same as the direction of a (−)X-direction component of the magnetic field. Therefore, the bias magnetic field is intensified in the (−)X direction, and thus the rotation of the magnetization direction of the free magnetic layer 26 is suppressed. Consequently, the electrical resistance of the Y-direction detecting element 20$y$ in this case is higher than the electrical resistance of the Y-direction detecting element 20$y$(i).

As described above, as the Y-direction detecting element 20$y$ moves away from the center O of the magnet 2 in the ±X direction, an error is superimposed on a detection value of the position on the Y coordinate. Therefore, when a single Y-direction detecting element 20$y$ and a single X-direction detecting element 20$x$ which is the same magnetoresistive element as the Y-direction detecting element 20$y$ rotated by 90 degrees are installed in a detector 10 to detect the position of the detector 10 on the X-Y coordinates, the linearity of the measurement position in the X direction and the Y direction is degraded.

Figure 11:
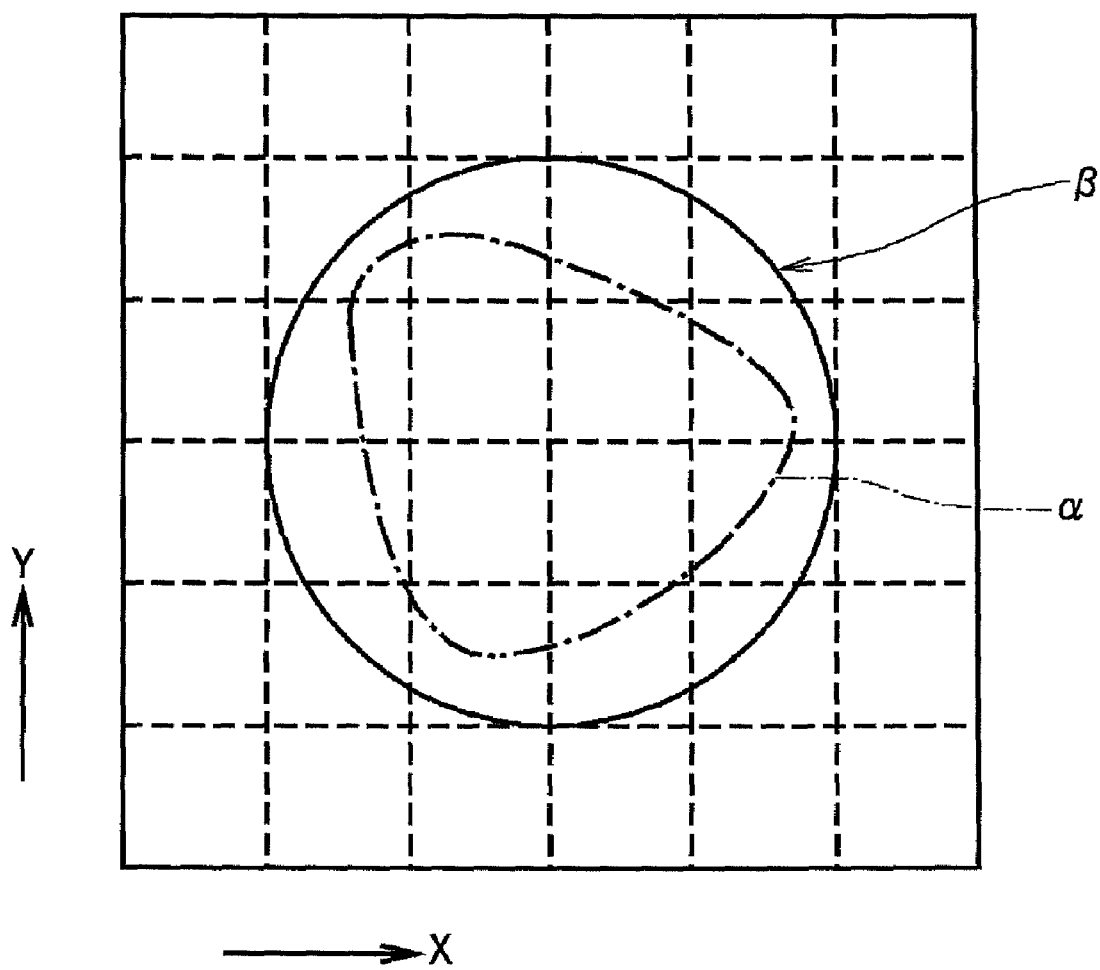
FIG. 11 is a diagram showing an effect of the position detector of an embodiment.

Line α shown in FIG. 11 is a plot of detection values of positions in the X direction and detection values of positions in the Y direction obtained from a detector 10 including a single Y-direction detecting element 20$y$ and a single X-direction detecting element 20$x$. Line α shown in FIG. 11 is a plot of detection output from the Y-direction detecting element 20y and detection output from the X-direction detecting element 20x when the detector 10 is moved so as to make a circle such that the radius from the center O of the magnet 2 is constant. As shown in FIG. 11, the position detector including the detector 10 having a single X-direction detecting element 20x and a single Y-direction detecting element 20y has a poor detection accuracy of the movement position on the X-Y coordinates.

Figure 7A:
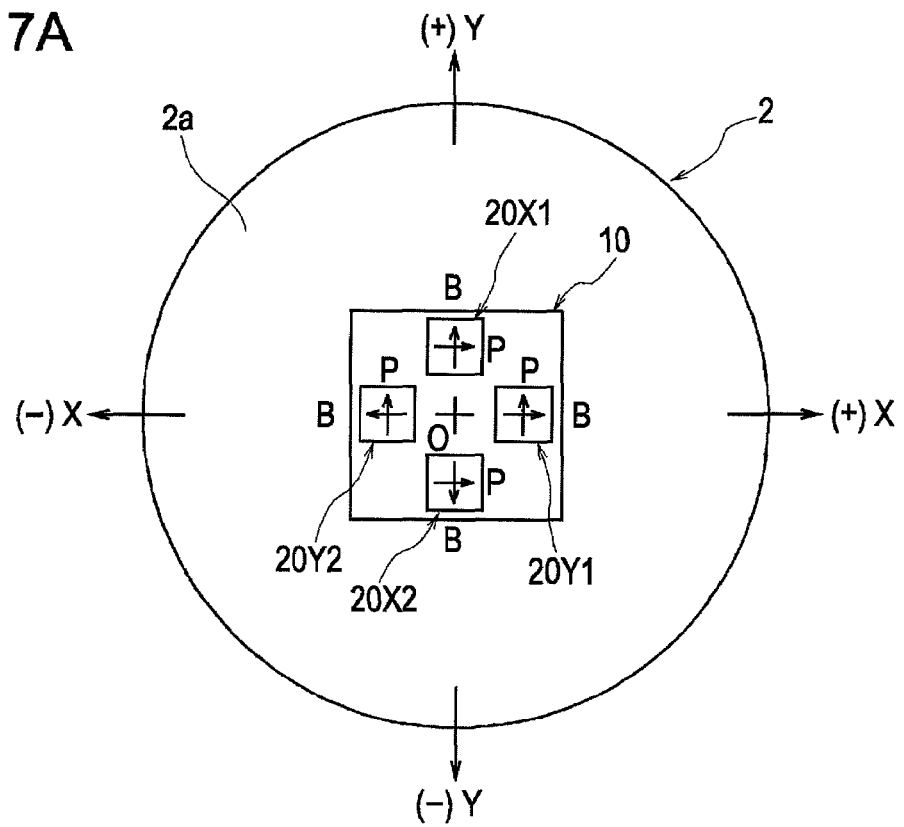
FIGS. 7A and 7B are plan views each showing the inner structure of a detector according to an embodiment of the present invention on the basis of the operation.

In an embodiment of the present invention, as shown in FIG. 7A, a detector 10 includes total four detecting elements, namely, a first X-direction detecting element 20X1, a second X-direction detecting element 20X2, a first Y-direction detecting element 20Y1, and a second Y-direction detecting element 20Y2. The four detecting elements are arranged on a plane parallel to a movement plane of the detector 10. Each of the first X-direction detecting element 20X1, the second X-direction detecting element 20X2, the first Y-direction detecting element 20Y1, and the second Y-direction detecting element 20Y2 is the magnetoresistive element 20 utilizing a giant magnetoresistive effect and having a structure substantially the same as that shown in FIGS. 5A and 5B, and FIG. 6.

In FIG. 7A, a pinned direction of magnetization of the pinned magnetic layer 24 of each of the detecting elements is denoted by "P direction", and a direction of a bias magnetic field provided to the free magnetic layer 26 from the magnets 33 and 34 is denoted by "B direction". The direction of a magnetoresistive element 20 constituting the second Y-direction detecting element 20Y2 is the same as that shown in FIG. 5A. The direction B of the bias magnetic field of the first Y-direction detecting element 20Y1 is opposite by 180 degrees with respect to the direction B of the second Y-direction detecting element 20Y2. The first Y-direction detecting element 20Y1 corresponds to a magnetoresistive element in which the magnet 33 and the magnet 34 for applying a bias magnetic field are exchanged with each other in the magnetoresistive element 20 shown in FIG. 5A.

The first X-direction detecting element 20X1 corresponds to a magnetoresistive element obtained by rotating the second Y-direction detecting element 20Y2 by 90 degrees in the clockwise direction, and the second X-direction detecting element 20X2 corresponds to a magnetoresistive element obtained by rotating the first Y-direction detecting element 20Y1 by 90 degrees in the clockwise direction.

In each of the first X-direction detecting element 20X1 and the second X-direction detecting element 20X2, the direction B of the bias magnetic field acting on the free magnetic layer 26 is parallel to the Y axis. The direction B of the bias magnetic field in the first X-direction detecting element 20X1 is opposite to the direction B of the bias magnetic field in the second X-direction detecting element 20X2. Similarly, in each of the first Y-direction detecting element 20Y1 and the second Y-direction detecting element 20Y2, the direction B of the bias magnetic field acting on the free magnetic layer 26 is parallel to the X axis. The direction B of the bias magnetic field in the first Y-direction detecting element 20Y1 is opposite to the direction B of the bias magnetic field in the second Y-direction detecting element 20Y2.

In each of the first X-direction detecting element 20X1 and the second X-direction detecting element 20X2, the pinned direction of magnetization of the pinned magnetic layer 24 (P direction) is preferably parallel to the X axis and oriented in the (+)X direction. Alternatively, the pinned direction (P direction) of one of the first X-direction detecting element 20X1 and the second X-direction detecting element 20X2 may be the (+)X direction, and the pinned direction (P direction) of the other X-direction detecting element may be the (−)X direction. In each of the first Y-direction detecting element 20Y1 and the second Y-direction detecting element 20Y2, the pinned direction of magnetization of the pinned magnetic layer 24 (P direction) is preferably parallel to the Y axis and oriented in the (+)Y direction. Alternatively, the pinned direction (P direction) of one of the first Y-direction detecting element 20Y1 and the second Y-direction detecting element 20Y2 may be the (+)Y direction, and the pinned direction (P direction) of the other Y-direction detecting element may be the (−)Y direction.

Figure 7B:
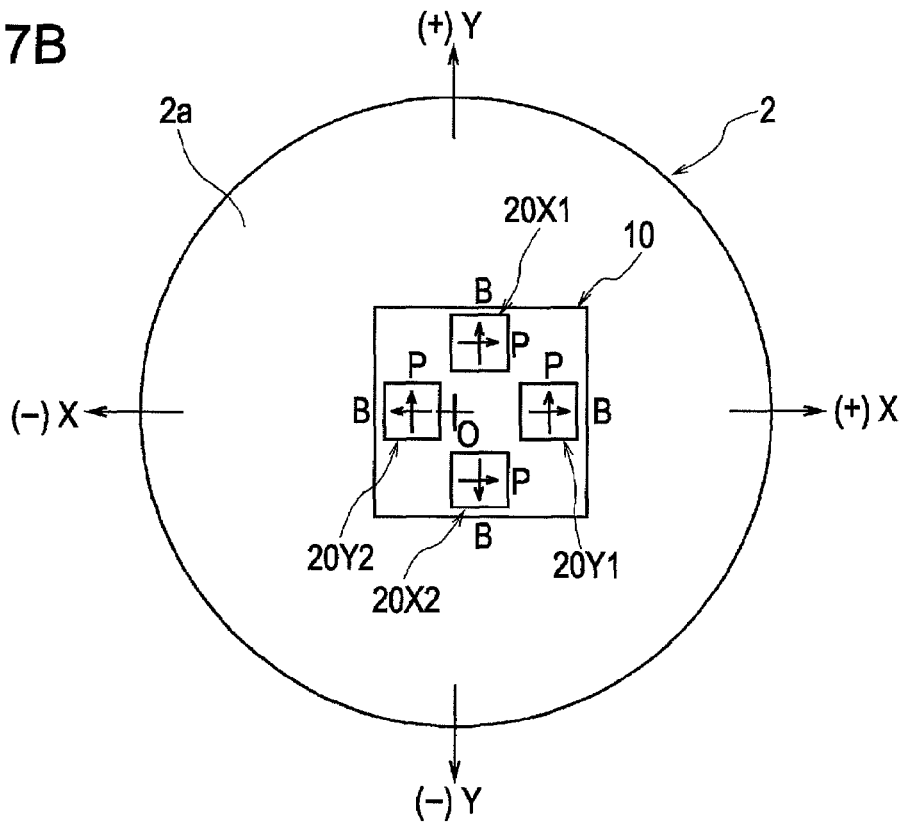
Figure 8:
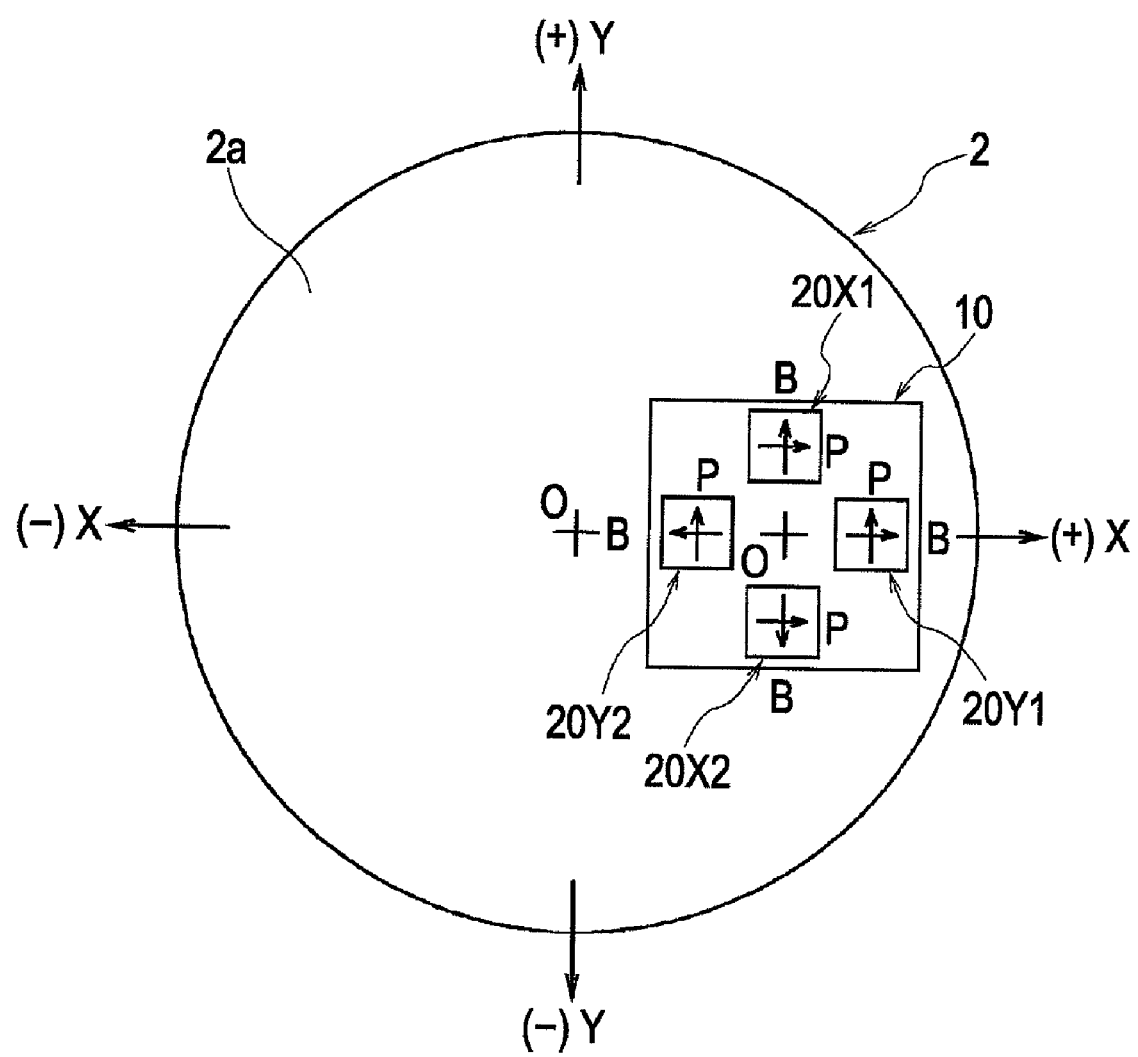
FIG. 8 is a plan view showing a state in which the detector has largely moved from the position shown in FIG. 7A.

As shown in FIGS. 7A and 7B, and FIG. 8, the geometric center Oa of the element portions 21 of the first X-direction detecting element 20X1 and the geometric center Oa of the element portions 21 of the second X-direction detecting element 20X2 are preferably located at positions having the same X coordinate. Similarly, the geometric center Oa of the element portions 21 of the first Y-direction detecting element 20Y1 and the geometric center Oa of the element portions 21 of the second Y-direction detecting element 20Y2 are preferably located at positions having the same Y coordinate.

Accordingly, as shown in FIG. 7A, when the center of the detector 10 is located at the same position as the center O of the magnet 2, the center Oa of the first X-direction detecting element 20X1 and the center Oa of the second X-direction detecting element 20X2 are located on the Y axis with the center O of the magnet 2 therebetween. In addition, the absolute value of the coordinate on the Y axis at which the center Oa of the first X-direction detecting element 20X1 is located is the same as the absolute value of the coordinate on the Y axis at which the center Oa of the second X-direction detecting element 20X2 is located.

Similarly, as shown in FIG. 7A, when the center of the detector 10 is located at the same position as the center O of the magnet 2, the center Oa of the first Y-direction detecting element 20Y1 and the center Oa of the second Y-direction detecting element 20Y2 are located on the X axis with the center O of the magnet 2 therebetween. In addition, the absolute value of the coordinate on the X axis at which the center Oa of the first Y-direction detecting element 20Y1 is located is the same as the absolute value of the coordinate on the X axis at which the center Oa of the second Y-direction detecting element 20Y2 is located.

In the present invention, in the detector 10, the center Oa of the first X-direction detecting element 20X1 and the center Oa of the second X-direction detecting element 20X2 may shift in opposite directions parallel to the X axis, and the center Oa of the first Y-direction detecting element 20Y1 and the center Oa of the second Y-direction detecting element 20Y2 may shift in opposite directions parallel to the Y axis.

However, as shown in FIG. 7A, when the detecting elements 20X1, 20X2, 20Y1, and 20Y2 are uniformly arranged with respect to the center O of the magnet 2 and each of the detecting elements 20X1, 20X2, 20Y1, and 20Y2 is located on the X axis or the Y axis, at the initial position at which the detector 10 is located at the center O of the magnet 2, the effect from the magnet 2 on the bias magnetic field of the free magnetic layer 26 of the first X-direction detecting element 20X1 is the same as that of the second X-direction detecting element 20X2, and the effect from the magnet 2 on the bias magnetic field of the free magnetic layer 26 of the first Y-direction detecting element 20Y1 is the same as that of the second Y-direction detecting element 20Y2. Consequently, the output from the detector 10 is stabilized at the initial state. Furthermore, the linearity between a change in the detection position on the X coordinate and a change in the detection position on the Y coordinate when the detector 10 starts to move in the X direction and the Y direction can be easily maintained.

In FIGS. 7A and 7B and FIG. 8, the dimensions of the detector 10 and the detecting elements 20X1, 20X2, 20Y1, and 20Y2 relative to the dimensions of the magnet 2 are larger than the actual sizes thereof. In reality, the dimensions of the detector 10 and the detecting elements 20X1, 20X2, 20Y1, and 20Y2 are sufficiently smaller than the dimensions of the magnet 2, and the detecting elements 20X1, 20X2, 20Y1, and 20Y2 can move within the range between +Hr and −Hr in which the linearity of a change in the magnetic field can be maintained, as shown in FIG. 2.

Figure 9:
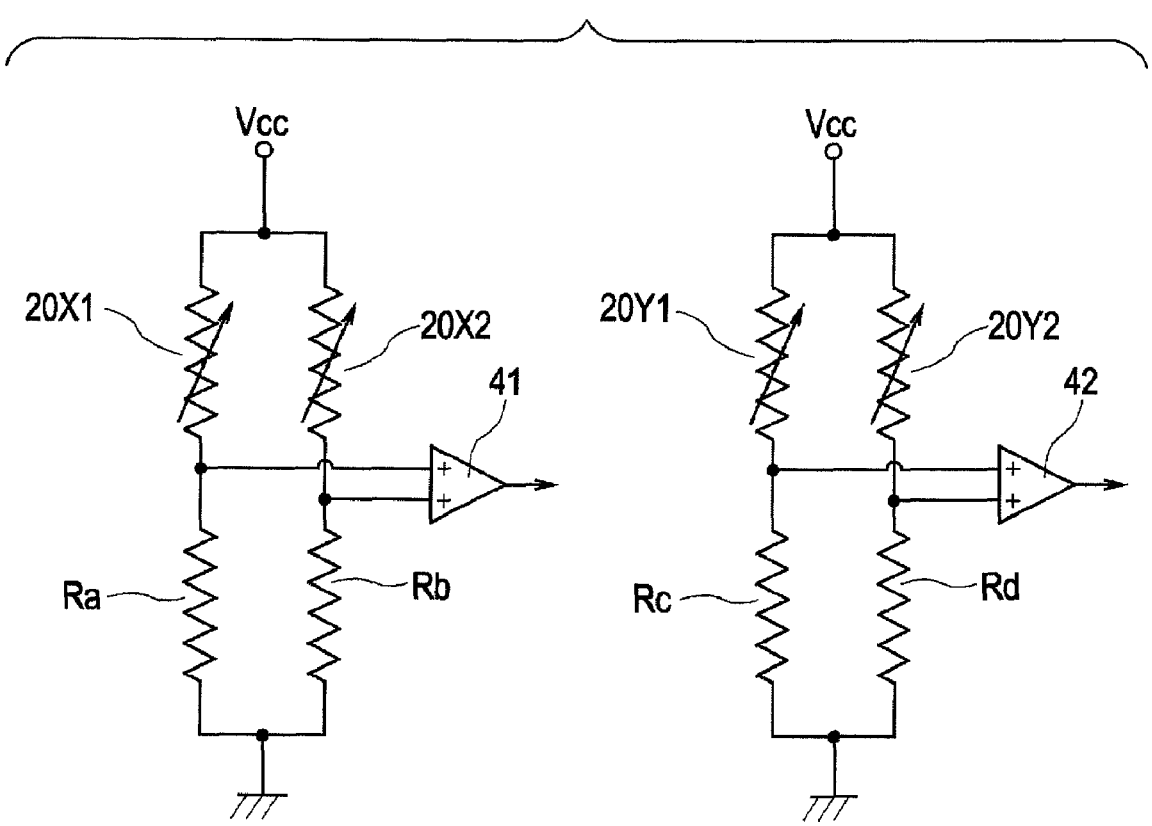
FIG. 9 includes circuit diagrams of the detector.

FIG. 9 schematically shows detection circuits provided in the detector 10.

A fixed resistor Ra is connected to the first X-direction detecting element 20X1 in series, and a fixed resistor Rb is connected to the second X-direction detecting element 20X2 in series. A power supply voltage Vcc is applied to the first X-direction detecting element 20X1 and the fixed resistor Ra, and the power supply voltage Vcc is applied to the second X-direction detecting element 20X2 and the fixed resistor Rb. The value of resistance of the fixed resistor Ra is the same as the value of resistance of the fixed resistor Rb. An intermediate voltage between the first X-direction detecting element 20X1 and the fixed resistor Ra and an intermediate voltage between the second X-direction detecting element 20X2 and the fixed resistor Rb are preferably added in an adder 41 to obtain a position detection output of the X direction.

In addition, the first Y-direction detecting element 20Y1 is connected to a fixed resistor Rc in series, and the second Y-direction detecting element 20Y2 is connected to a fixed resistor Rd in series. A power supply voltage Vcc is applied to the first Y-direction detecting element 20Y1 and the fixed resistor Rc, and the power supply voltage Vcc is applied to the second Y-direction detecting element 20Y2 and the fixed resistor Rd. The value of resistance of the fixed resistor Rc is the same as the value of resistance of the fixed resistor Rd. An intermediate voltage between the first Y-direction detecting element 20Y1 and the fixed resistor Rc and an intermediate voltage between the second Y-direction detecting element 20Y2 and the fixed resistor Rd are preferably added in an adder 42 to obtain a position detection output of the Y direction.

FIG. 7B shows a state where the detector 10 has moved from the initial position shown in FIG. 7A in the (+)X direction. In FIG. 7B, the first Y-direction detecting element 20Y1 has moved to the (+)X side with respect to the center O of the magnet 2, but the second Y-direction detecting element 20Y2 is located at the (−)X side with respect to the center O of the magnet 2.

In FIG. 7B, the detector 10 has moved only in the (+)X direction, but has not moved in the Y direction. Therefore, the first X-direction detecting element 20X1 and the second X-direction detecting element 20X2 are located at positions equidistant from the center O of the magnet 2 in the (+)Y direction and the (−)Y direction, and the absolute value of the magnitude of the bias magnetic field in the +Y direction acting on the free magnetic layer 26 of the first X-direction detecting element 20X1 is the same as the absolute value of the magnitude of the bias magnetic field in the −Y direction acting on the free magnetic layer 26 of second X-direction detecting element 20X2. Accordingly, an angle formed by rotating the direction of the magnetization of the free magnetic layer 26 of the first X-direction detecting element 20X1 in the clockwise direction by a (+)X-direction component of the magnetic field generated from the magnet 2 is equal to an angle formed by rotating the direction of the magnetization of the free magnetic layer 26 of the second X-direction detecting element 20X2 in the counterclockwise direction by a (+)X-direction component of the magnetic field generated from the magnet 2. Accordingly, the electrical resistance of the first X-direction detecting element 20X1 and the electrical resistance of the second X-direction detecting element 20X2 change by substantially the same amount. At this time, a detection output proportional to the movement distance of the detector 10 in the (+)X direction is obtained from the adder 41 shown in FIG. 9.

On the other hand, in the state shown in FIG. 7B, in addition to the bias magnetic field of the B direction, a (+)X-direction component of the magnetic field generated from the magnet 2 acts on the free magnetic layer 26 of the first Y-direction detecting element 20Y1. Accordingly, the magnetic field acting on the free magnetic layer 26 in the (+)X direction is stronger than the state shown in FIG. 7A. In contrast, in the free magnetic layer 26 of the second Y-direction detecting element 20Y2, the effect of the magnetic field of the (−)X direction, which is opposite to the bias magnetic field of the B direction, is weaker than the state shown in FIG. 7A. That is, in FIG. 7B, the intensity of the magnetic field acting on the free magnetic layer 26 of the second Y-direction detecting element 20Y2 in the (−)X direction is weaker than the state shown in FIG. 7A.

When the detector 10 moves from the position shown in FIG. 7B in the (+)Y direction, the magnetization direction of the free magnetic layer 26 of the first Y-direction detecting element 20Y1 is rotated in the counterclockwise direction, and the magnetization direction of the free magnetic layer 26 of the second Y-direction detecting element 20Y2 is rotated in the clockwise direction. In this case, in the first Y-direction detecting element 20Y1, the substantial bias magnetic field is increased compared with a case where the detector 10 moves from the position shown in FIG. 7A in the (+)Y direction. Therefore, the magnetization direction of the free magnetic layer 26 of the first Y-direction detecting element 20Y1 is not readily rotated. In contrast, in the second Y-direction detecting element 20Y2, the substantial bias magnetic field is decreased compared with a case where the detector 10 moves from the position shown in FIG. 7A in the (+)Y direction. Therefore, the magnetization direction of the free magnetic layer 26 of the second Y-direction detecting element 20Y2 is readily rotated.

In a state where the detector 10 has moved to the (−)X side relative to the position shown in FIG. 7A, the state being opposite to the state shown in FIG. 7B, in the second Y-direction detecting element 20Y2, a (−)X-direction component of the magnetic field generated from the magnet 2 is added to the bias magnetic field acting on the free magnetic layer 26. In contrast, in the first Y-direction detecting element 20Y1, an effect of the (+)X-direction component of the magnetic field generated from the magnet 2 on the free magnetic layer 26 is decreased. Accordingly, when the detector 10 moves in the Y direction from the position as a starting point, the magnetization direction of the free magnetic layer 26 is readily rotated in the first Y-direction detecting element 20Y1, and the magnetization direction of the free magnetic layer 26 is not readily rotated in the second Y-direction detecting element 20Y2.

As described above, when the detector 10 moves in the X direction, the following relationship is satisfied. Specifically, in one of the first Y-direction detecting element 20Y1 and the second Y-direction detecting element 20Y2, the bias magnetic field acting on the free magnetic layer 26 is increased, thereby decreasing the sensitivity, and in the other Y-direction detecting element, the bias magnetic field is decreased, thereby increasing the sensitivity. Accordingly, as shown in FIG. 9, by adding the value of change in the voltage based on a change in the resistance of the first Y-direction detecting element 20Y1 and the value of change in the voltage based on a change in the resistance of the second Y-direction detecting element 20Y2, a decrease in the sensitivity of one of the Y-direction detecting elements can be cancelled out by an increase in the sensitivity of the other Y-direction detecting element. Consequently, even when the detector 10 is located at any position in the X direction, the movement position in the (+)Y direction and in the (−)Y direction can be detected so as to proportionally change as a linear function.

The relationship described above applies to the relationship between the magnetic field acting on the free magnetic layer 26 of the first X-direction detecting element 20X1 and the magnetic field acting on the free magnetic layer 26 of the second X-direction detecting element 20X2 when the detector 10 moves in the Y direction.

Consequently, when the detector 10 is circulated while maintaining the radius from the center O of the magnet 2 to be constant, and the position detection output of the X direction obtained from the adder 41 shown in FIG. 9 and the position detection output of the Y direction obtained from the adder 42 are plotted, a substantially circular detection trajectory can be obtained, as shown by line β in FIG. 11.

Next, FIG. 8 shows a case where the detector 10 has moved on the top surface 2a of the magnet 2 by a distance slightly larger than the distance shown in FIG. 7B. In FIG. 8, both the first Y-direction detecting element 20Y1 and the second Y-direction detecting element 20Y2 have moved to the (+)X side with respect to the center O of the magnet 2. In this case, in the first Y-direction detecting element 20Y1, the bias magnetic field of the B direction acting on the free magnetic layer 26 is intensified by the (+)X-direction component of the magnetic field. In the second Y-direction detecting element 20Y2, the bias magnetic field of the B direction acting on the free magnetic layer 26 is weakened by the (+)X-direction component of the magnetic field.

On the other hand, when the detector 10 has moved in the (−)X direction and both the first Y-direction detecting element 20Y1 and the second Y-direction detecting element 20Y2 have moved in the (−)Y direction with respect to the center O of the magnet 2, the bias magnetic field acting on the free magnetic layer 26 of the first Y-direction detecting element 20Y1 is weakened, and the bias magnetic field acting on the free magnetic layer 26 of the second Y-direction detecting element 20Y2 is intensified.

As described above, even in the case where the detector 10 has moved in the X direction until the detector 10 passes through the center O of the magnet 2, when the sensitivity of one of the first Y-direction detecting element 20Y1 and the second Y-direction detecting element 20Y2 increases, the sensitivity of the other Y-direction detecting element decreases. Accordingly, even when the first Y-direction detecting element 20Y1 and the second Y-direction detecting element 20Y2 are located at any positions in the X direction, the movement position of the detector 10 in the Y direction can be accurately detected on the basis of a linear function by adding the output corresponding to a change in the resistance of the first Y-direction detecting element 20Y1 and the output corresponding to a change in the resistance of the second Y-direction detecting element 20Y2. This also applies to a detection of the movement position of the X direction obtained from the first X-direction detecting element 20X1 and the second X-direction detecting element 20X2.

In the movement shown in FIG. 8, it is preferable that each of the detecting elements 20X1, 20X2, 20Y1, and 20Y2 installed in the detector 10 moves within the range between +Hr and −Hr in which the intensity of the magnetic field of the magnet 2 can change on the basis of a linear function, as shown in FIG. 2.

Figure 10:
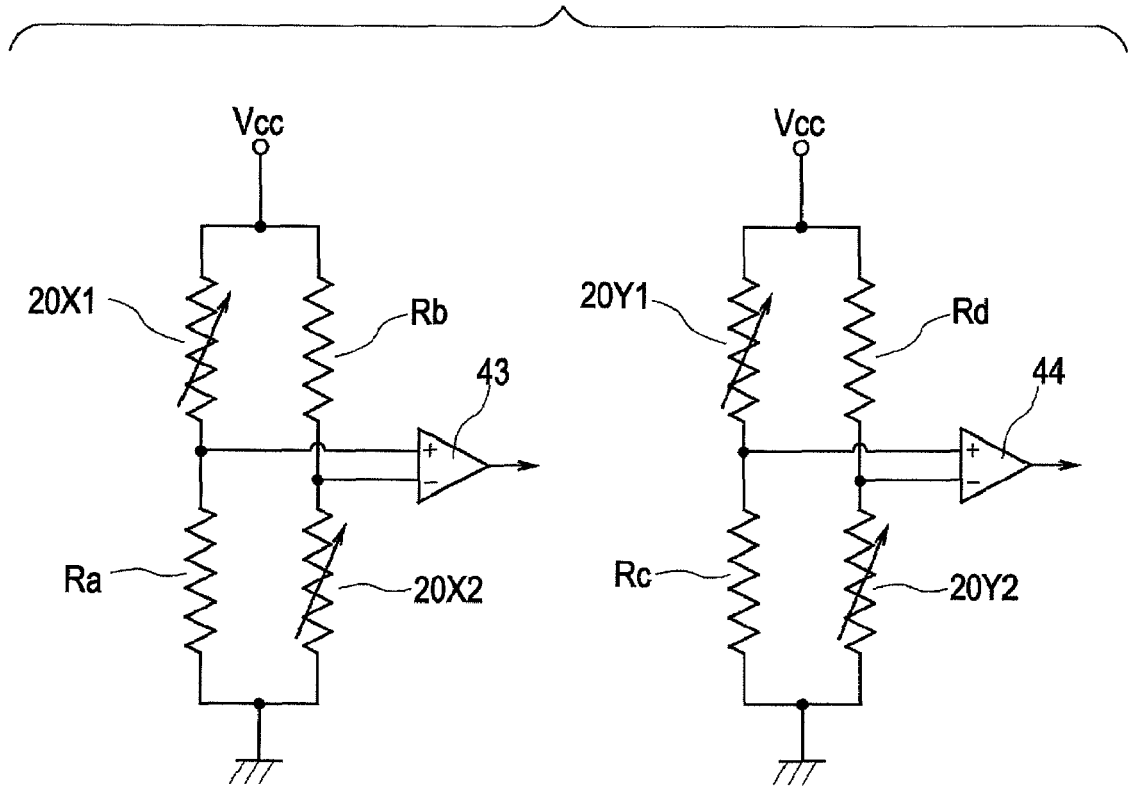
FIG. 10 includes circuit diagrams of a detector of another embodiment.

The detecting elements 20X1, 20X2, 20Y1, and 20Y2 shown in FIGS. 7A and 7B, and FIG. 8 may constitute detection circuits shown in FIG. 10. In the left circuit shown in FIG. 10, the arrangement of the second X-direction detecting element 20X2 and the fixed resistor Rb is opposite to the left circuit shown in FIG. 9. In the right circuit shown in FIG. 10, the arrangement of the second Y-direction detecting element 20Y2 and the fixed resistor Rd is opposite to the right circuit shown in FIG. 9.

In the circuits shown in FIG. 10, the differences in intermediate voltages are determined by differential amplifiers 43 and 44. The left circuit shown in FIG. 10 adds the absolute value of the voltage based on a change in the resistance of the first X-direction detecting element 20X1 and the absolute value of the voltage based on a change in the resistance of the second X-direction detecting element 20X2. This addition is similarly performed in the first Y-direction detecting element 20Y1 and the second Y-direction detecting element 20Y2. In each of the pair of X-direction detecting elements and the pair of the Y-direction detecting elements, a decrease in the sensitivity of one of the detecting elements is compensated for by an improvement in the sensitivity of the other detecting element by using the above detection circuits. Accordingly, an accurate position detection can be realized.

Alternatively, in FIG. 7A, the pinned direction (P direction) of the magnetization of the pinned magnetic layer 24 of the first X-direction detecting element 20X1 may be opposite to the pinned direction of the magnetization of the pinned magnetic layer 24 of the second X-direction detecting element 20X2, and the pinned direction (P direction) of the magnetization of the pinned magnetic layer 24 of the first Y-direction detecting element 20Y1 may be opposite to the pinned direction of the magnetization of the pinned magnetic layer 24 of the second Y-direction detecting element 20Y2. In this case, instead of the adders 41 and 42 in the circuits shown in FIG. 9, differential amplifiers that subtract one intermediate voltage from the other intermediate voltage can be provided. Alternatively, in the circuits shown in FIG. 10, adders can be provided instead of the differential amplifiers 43 and 44.

The position detector 1 having the above structure is mounted, for example, inside a compact precision instrument. The compact precision instrument includes a fixed part and a movable stage. The movable stage is moved within the X-Y coordinates by a magnetically driven actuator that exerts a driving force in the X direction and a magnetically driven actuator that exerts a driving force in the Y direction. A magnet 2 is provided on one of the fixed part and the movable stage, and a detector 10 is provided on the other of the fixed part and the movable stage. By detecting the position of the movable stage moved by the magnetically driven actuators and monitoring position detection outputs with a controller, the position detector 1 can be driven while recognizing the movement position of the movable stage with high accuracy. In this case, the magnet 2 may be provided on the fixed part, and the detector 10 may be installed on the movable stage. Alternatively, the magnet 2 may be installed on the movable stage, and the detector 10 may be provided on the fixed part.

Figure 12:
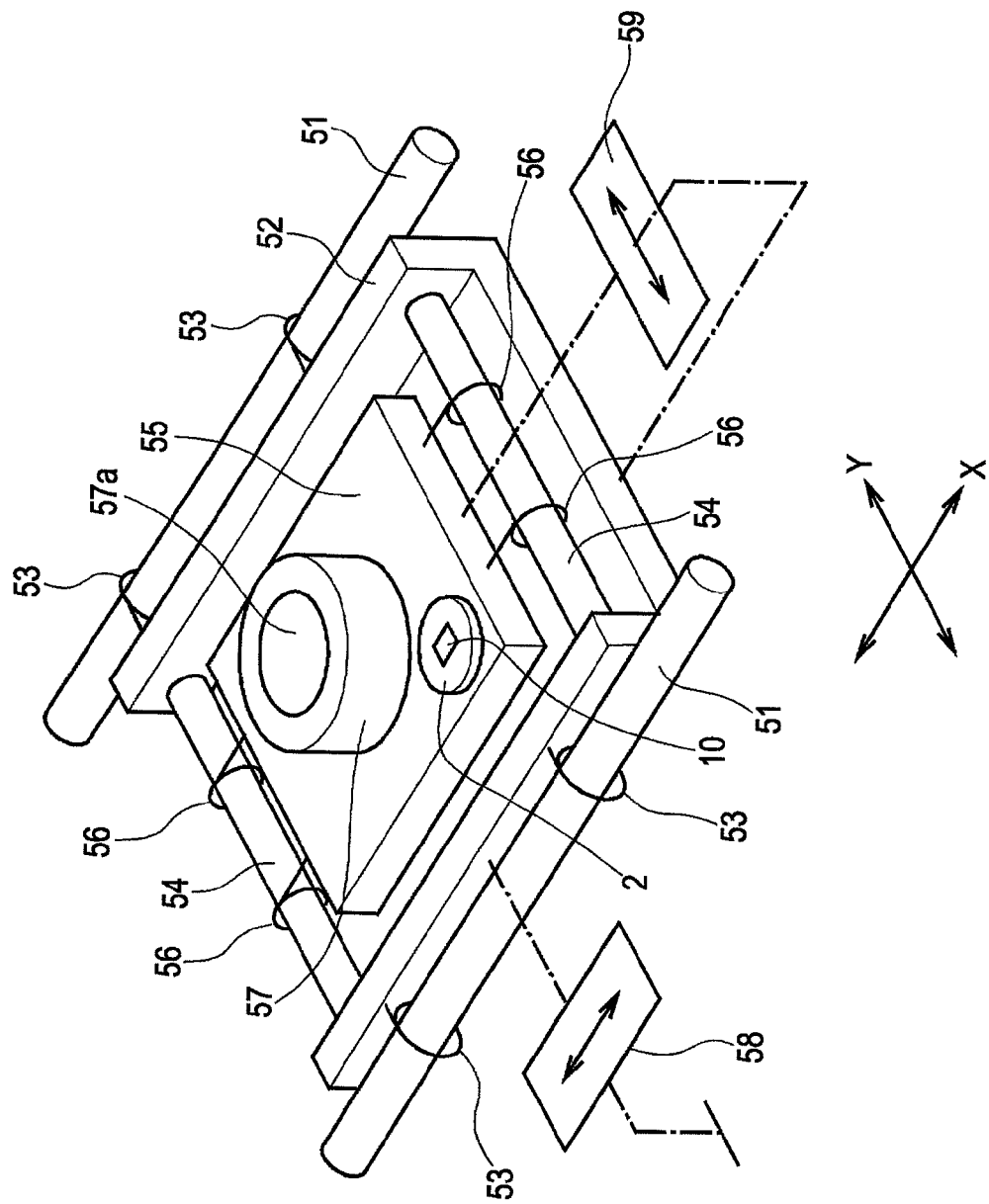
FIG. 12 is a perspective view showing an example in which the position detector is applied to a hand-shake correction device.
Figure 13:
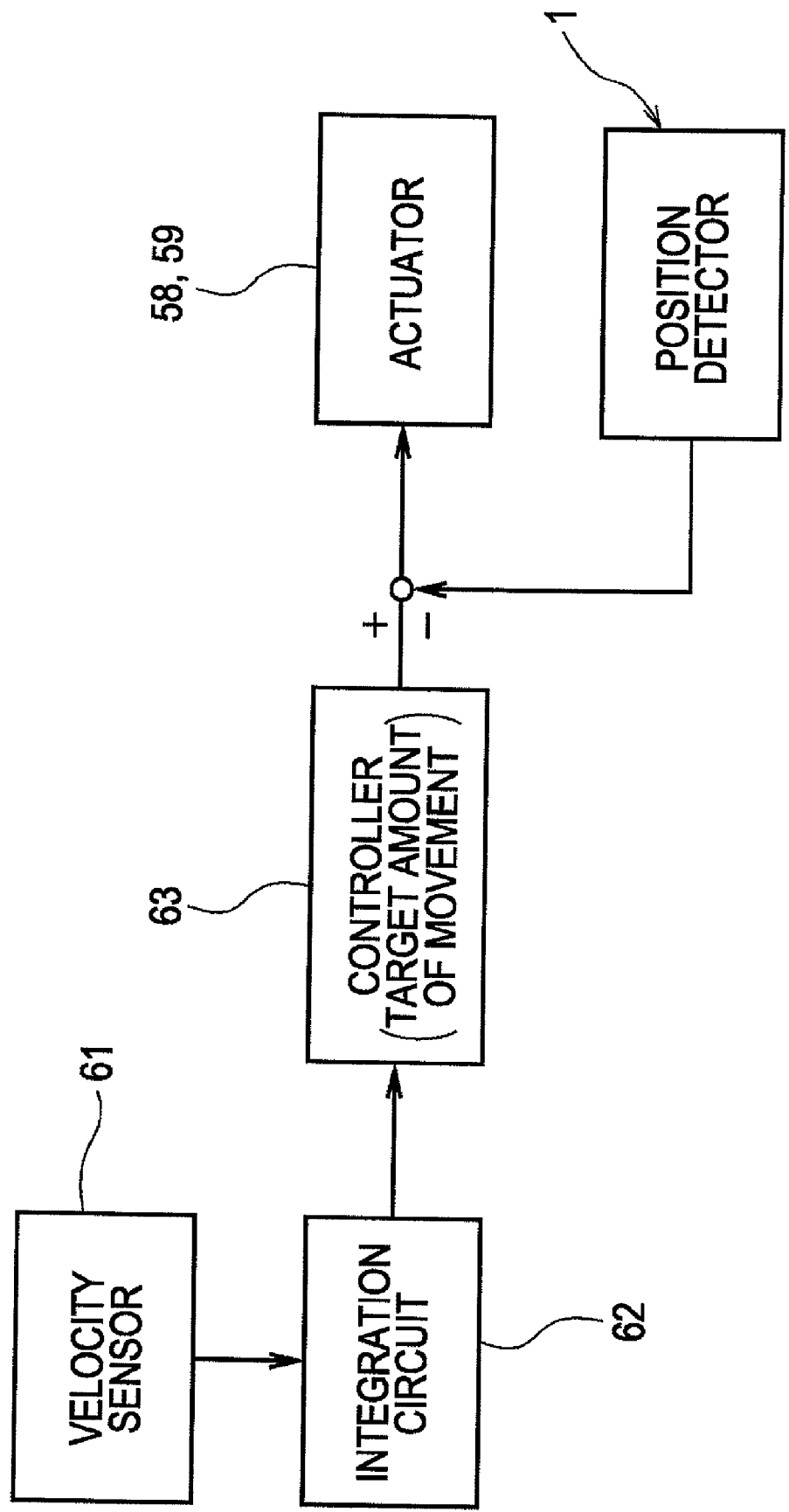
FIG. 13 is a circuit diagram of the hand-shake correction device.

FIG. 12 shows an embodiment in which the position detector 1 is used for motion blur correction of a video camera or a digital camera caused by hand shake. FIG. 13 schematically shows a circuit diagram of the embodiment.

As shown in FIG. 12, in a supporting base (not shown) of the camera, a pair of X guide shafts 51 extending in a direction parallel to the X direction are fixed. An X stage 52 is supported by the X guide shafts 51 so as to freely reciprocally move in the X direction along the X guide shafts 51 via bearings 53. The bearings 53 are shown by schematic views. A pair of Y guide shafts 54 extending in a direction parallel to the Y direction are fixed in the X stage 52. A movable stage 55 is supported by the Y guide shafts 54 so as to freely reciprocally move in the Y direction along the Y guide shafts 54 via bearings 56. The bearings 56 are also shown by schematic views. By combining the movements of the X stage 52 and the movable stage 55, the movable stage 55 can freely change its position within the X-Y plane.

A lens barrel 57 is fixed to the movable stage 55, and a camera lens 57*a* is installed in the lens barrel 57. The optical axis of the camera lens 57*a* is orthogonal to both the X direction and the Y direction.

An X-axis actuator 58 is provided between the X stage 52 and the supporting base of the camera, and a Y-axis actuator 59 is provided between the movable stage 55 and the X stage 52. The illustration of the detailed structures of the X-axis actuator 58 and the Y-axis actuator 59 is omitted. In the X-axis actuator 58, a magnet is provided on one of the supporting base and the X stage 52, and a coil that exerts an electromagnetic force in the X direction between the magnet and the coil is provided on the other of the supporting base and the X stage 52. In the Y-axis actuator 59, a magnet is provided on one of the X stage 52 and the movable stage 55, and a coil that exerts an electromagnetic force in the Y direction between the magnet and the coil is provided on the other of the X stage 52 and the movable stage 55.

The magnet 2 constituting the position detector 1 shown in FIGS. 7A and 7B, and FIG. 8 is provided on the movable stage 55 that moves in the X direction and the Y direction. A part of the supporting base, e.g., a fixed panel, faces the upper surface of the movable stage 55. The above-described detector 10 is installed on the fixed panel or the like. The magnet 2 disposed at the movable side faces the detector 10 disposed at the fixed side at a height Zh in the range of 0.5 to 1.5 mm. Alternatively, the magnet 2 may be provided on the lower surface of the movable stage 55, and the detector 10 may be provided on the supporting base facing the lower surface. Alternatively, the detector 10 may be provided on the movable stage 55, and the magnet 2 may be provided on the supporting base.

As shown in FIG. 13, in the supporting base or a camera body, a velocity sensor 61 is installed in a non-movable area other than the X stage 52 or the movable stage 55. Outputs from this velocity sensor 61 are integrated in an integration circuit 62 and provided to a controller 63 as hand shake distance information. When information on the amount of hand shake is obtained from the integration circuit 62, directions of correction movement and amounts of correction movement of the movable stage 55 for cancelling out the hand shake are calculated in the controller 63. The X-axis actuator 58 and the Y-axis actuator 59 are driven on the basis of the data of the amounts of correction movement, and the camera lens 57*a* is moved within the X-Y plane.

In this case, movement information on the movable stage 55 and the camera lens 57*a* is obtained from detection outputs from the position detector 1 composed of the magnet 2 and the detector 10, i.e., the detection outputs from the detector 10 shown in FIGS. 7A and 7B, and FIG. 8. In the controller 63, driving signals provided to the actuators 58 and 59 are controlled on the basis of the information on the amount of movement obtained from the detector 10. Accordingly, the camera lens 57*a* is controlled so as to move by a target amount of movement by which the hand shake can be cancelled out.

Figure 14A:
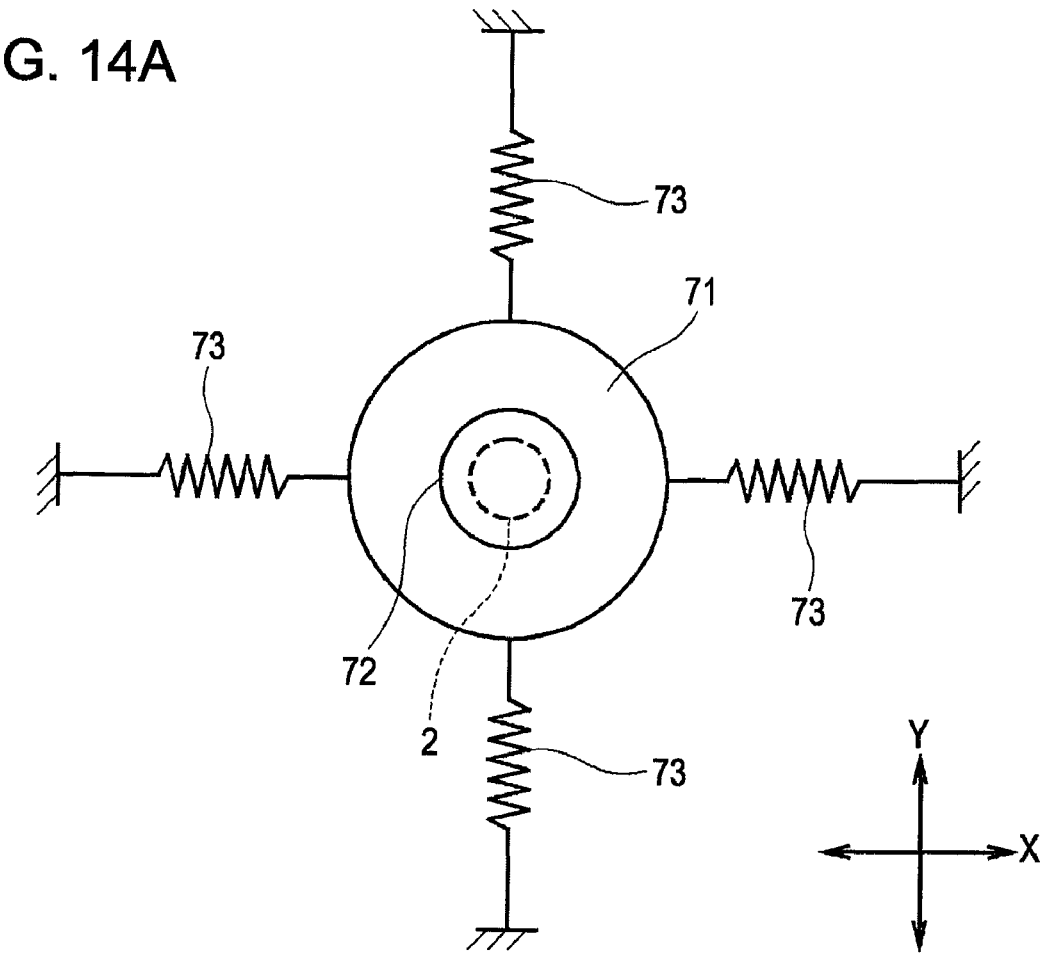
FIGS. 14A and 14B are views illustrating an example in which the position detector is applied to an input operation device.
Figure 14B:
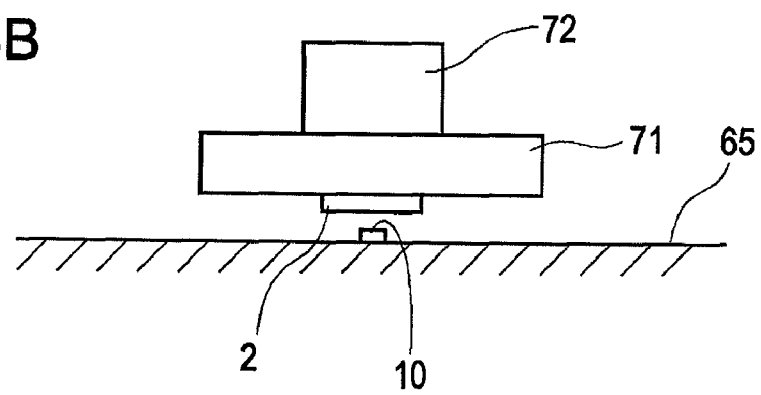

FIGS. 14A and 14B show an example of an input operation device including the position detector 1 described above.

An operation body 71 functioning as a movable part can freely move within the X-Y plane, which is a plane parallel to a surface of a supporting base 65, with a clearance between the supporting base 65 functioning as a fixed part. A supporting structure that supports the operation body 71 so that the operation body 71 can move within the X-Y plane is provided on the supporting base 65, but the illustration of the supporting structure is omitted in FIG. 14B. The operation body 71 may be a movable part that can move in only two orthogonal directions of the X direction and the Y direction. Alternatively, the operation body 71 may be supported so as to freely move in any direction within the X-Y plane. When no external force acts on the operation body 71, the operation body 71 is located at a neutral position by means of neutral springs 73.

As shown in FIG. 14B, an operation knob 72 projecting upward is integrally formed on the operation body 71. In addition, a magnet 2 construing a position detector 1 is provided on the lower surface of the operation body 71, and a detector 10 is provided on the supporting base 65. The magnet 2 faces the detector 10 with a distance Zh in the range of 0.5 to 1.5 mm therebetween.

When the operation body 71 is moved along the X-Y plane by operating the operation knob 72, movement information on the X direction and movement information on the Y direction can be obtained from the detector 10. Thereby, operation input signals in the X direction and the Y direction can be generated.

What is claimed is:

1. A position detector comprising:
   a fixed part;
   a movable part configured to face the fixed part and to move within a plane;
   a magnet provided on one of the fixed part and the movable part; and
   a detector provided on the other of the fixed part and the movable part and configured to detect a magnetic field generated from the magnet,
   wherein the magnet has a top surface facing the detector, and the top surface and a back surface of the magnet are magnetized to magnetic poles different from each other,
   the detector includes a first X-direction detecting element and a second X-direction detecting element each configured to detect the direction and intensity of the magnetic field parallel to an X axis, and a first Y-direction detecting element and a second Y-direction detecting element each configured to detect the direction and intensity of the magnetic field parallel to a Y axis, the X axis and the Y axis being orthogonal to each other within the plane on which the movable part moves,
   each of the first X-direction detecting element, the second X-direction detecting element, the first Y-direction detecting element, and the second Y-direction detecting element is a magnetoresistive element whose electrical resistance changes on the basis of the relationship between the direction of the magnetization of a pinned magnetic layer and the direction of the magnetization of a free magnetic layer,
   in the first X-direction detecting element and the second X-direction detecting element, bias magnetic fields provided to the free magnetic layers act in opposite directions parallel to the Y axis, and in the first Y-direction detecting element and the second Y-direction detecting element, bias magnetic fields provided to the free magnetic layers act in opposite directions parallel to the X axis, a movement position of the movable part in a direction parallel to the X axis can be determined from an output obtained from a change in the resistance of the first X-direction detecting element and an output obtained from a change in the resistance of the second X-direction detecting element, and a movement position of the movable part in a direction parallel to the Y axis can be determined from an output obtained from a change in the resistance of the first Y-direction detecting element and an output obtained from a change in the resistance of the second Y-direction detecting element.

2. The position detector according to claim 1, wherein the first X-direction detecting element and the second X-direction detecting element are arranged at positions having the same X coordinate, and the first Y-direction detecting element and the second Y-direction detecting element are arranged at positions having the same Y coordinate.

3. The position detector according to claim 2, wherein the first X-direction detecting element and the second X-direction detecting element are arranged with a space therebetween in a direction parallel to the Y axis, and the first Y-direction detecting element and the second Y-direction detecting element are arranged with a space therebetween in a direction parallel to the X axis.

4. The position detector according to claim 1, wherein the magnetization of the pinned magnetic layer of each of the first X-direction detecting element and the second X-direction detecting element is oriented in a direction parallel to the X axis, and the magnetization of the pinned magnetic layer of each of the first Y-direction detecting element and the second Y-direction detecting element is oriented in a direction parallel to the Y axis.

5. The position detector according to claim 1, wherein the movement position of the movable part in a direction parallel to the X axis can be determined by adding the absolute value of a change in the voltage based on a change in the resistance of the first X-direction detecting element and the absolute value of a change in the voltage based on a change in the resistance of the second X-direction detecting element, and the movement position of the movable part in a direction parallel to the Y axis can be determined by adding the absolute value of a change in the voltage based on a change in the resistance of the first Y-direction detecting element and the absolute value of a change in the voltage based on a change in the resistance of the second Y-direction detecting element.

6. The position detector according to claim 1, wherein the top surface of the magnet has a circular shape.

7. The position detector according to claim 1, wherein the coordinate position of the movable part in the positive direction and the negative direction of the X axis and the coordinate position of the movable part in the positive direction and the negative direction of the Y axis with the center of the top surface of the magnet therebetween can be determined.

8. The position detector according to claim 1, further comprising:

a supporting base;

a stage supported on the supporting base so as to be movable in a direction parallel to the X axis and in a direction parallel to the Y axis; and actuators configured to provide the stage with motive forces in a direction parallel to the X axis and in a direction parallel to the Y axis, wherein the magnet is provided on one of the supporting base and the stage, and the detector is provided on the other of the supporting base and the stage.

9. The position detector according to claim 8, further comprising:

a camera lens provided on the stage, a sensor configured to detect a movement of the supporting base; and a controller to which outputs of the sensor and detection outputs of the detector are input, wherein the controller calculates the amounts of correction movement of the stage on the basis of the outputs from the sensor, provides the actuators with driving signals on the basis of the amounts of correction movement and movement information on the stage obtained in the detector, and controls the stage to move in a direction in which a transfer velocity is cancelled out.

10. The position detector according to claim 1, further comprising:

a supporting base; and an operation body configured to be movable on the supporting base at least in a direction parallel to the X axis and a direction parallel to the Y axis, wherein the magnet is provided on one of the supporting base and the operation body and the detector is provided on the other of the supporting base and the operation body, and operating directions and the amounts of operation of the operation body can be detected from detection outputs of the detector.

* * * * *